United States Patent [19]
Shiba

[11] Patent Number: 6,144,583
[45] Date of Patent: Nov. 7, 2000

[54] SEMICONDUCTOR INTEGRATED CIRCUIT DEVICE

[75] Inventor: Kazuyoshi Shiba, Kodaira, Japan

[73] Assignee: Hitachi, Ltd., Tokyo, Japan

[21] Appl. No.: 09/497,548

[22] Filed: Feb. 3, 2000

Related U.S. Application Data

[63] Continuation of application No. 09/241,634, Feb. 2, 1999, Pat. No. 6,038,170.

[30] Foreign Application Priority Data

Feb. 5, 1998 [JP] Japan .................................. 10-39722

[51] Int. Cl.[7] .................................................. G11C 16/04
[52] U.S. Cl. .............................. 365/185.13; 365/185.11; 365/63
[58] Field of Search .......................... 365/185.13, 185.11, 365/63, 185.17, 185.05

[56] References Cited

U.S. PATENT DOCUMENTS

| | | | |
|---|---|---|---|
| 5,057,448 | 10/1991 | Kuroda | 437/52 |
| 5,392,238 | 2/1995 | Kirisawa | 365/63 |
| 5,440,509 | 8/1995 | Momodomi et al. | 365/195 |
| 5,682,350 | 10/1997 | Lee et al. | 365/185.13 |
| 5,898,616 | 4/1999 | Ono | 365/185.17 |

FOREIGN PATENT DOCUMENTS 4-208566  7/1992  Japan.

OTHER PUBLICATIONS

1995 IEEE International Solid–State Circuit Conference—Digest of Technical Papers, pp. 122–123.
1994 IEEE Journal of Solid–State Circuits, vol. 29, No. 4, Apr. 1994, pp. 454–460.
1987 IEDM Technical Digest, pp. 560–563.

*Primary Examiner*—Vu A. Le
*Attorney, Agent, or Firm*—Mattingly, Stanger & Malur, P.C.

[57] ABSTRACT

A nonvolatile memory of a hierarchical bit line structure having hierarchical bit lines constituted by a plurality of sub-bit lines. Each sub-bit line is connected to an appropriate main bit line through a first and a second selection MISFET, the first selection MISFET having a thin gate insulating film and used for read operations only, the second MISFET having a thick gate insulating film and used at least for write operations. In a write operation, the first selection MISFET has its drain or its gate supplied with a predetermined bias voltage so that the gate insulating film of the transistor will not be subject to a voltage defeating the dielectric strength of the film.

19 Claims, 17 Drawing Sheets

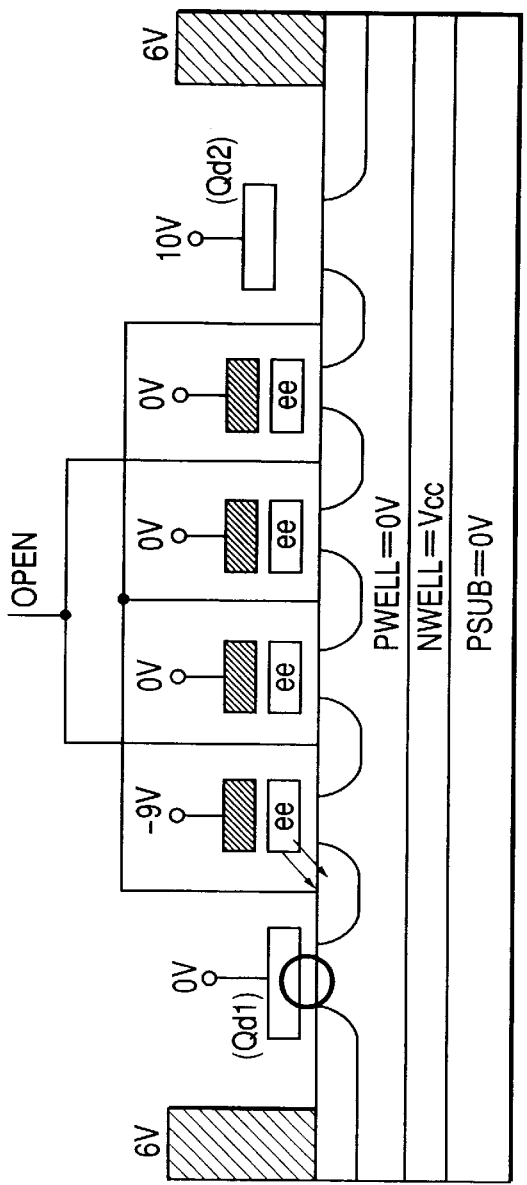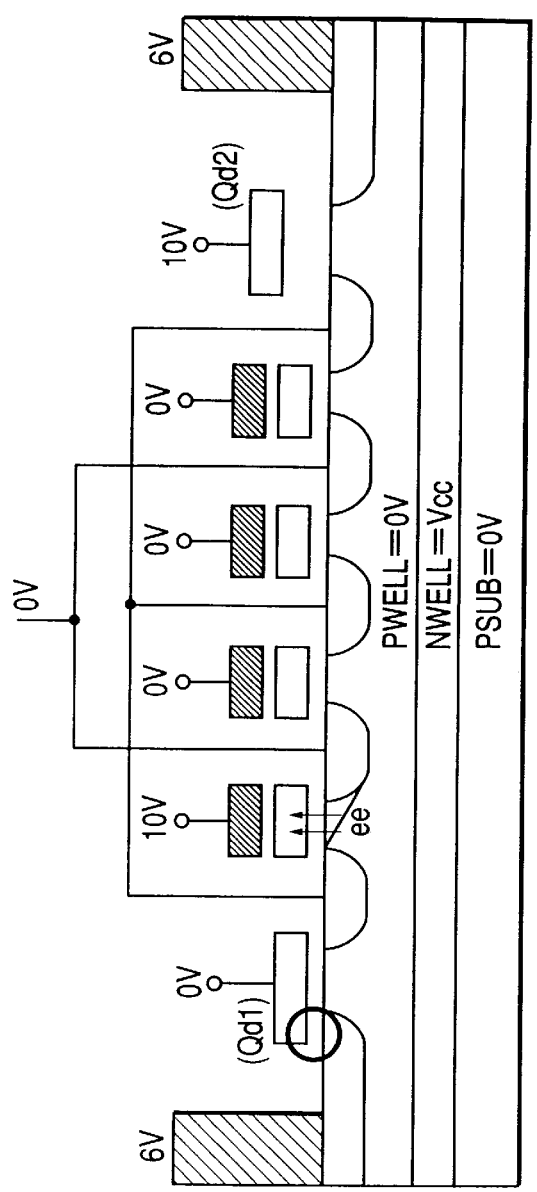
FIG. 6(A)
FIG. 6(B)

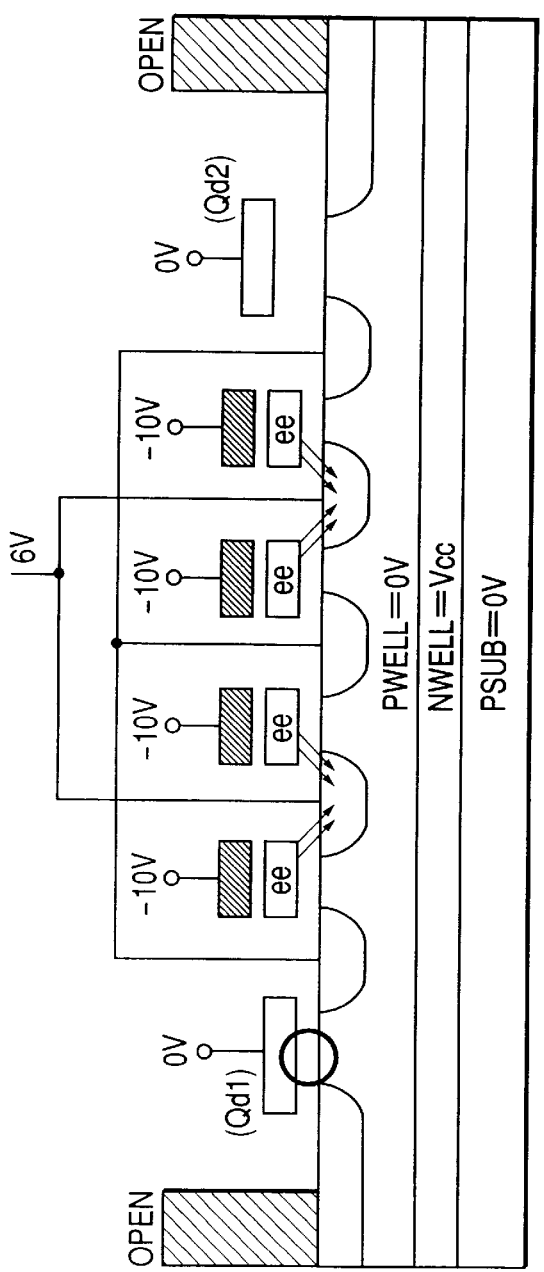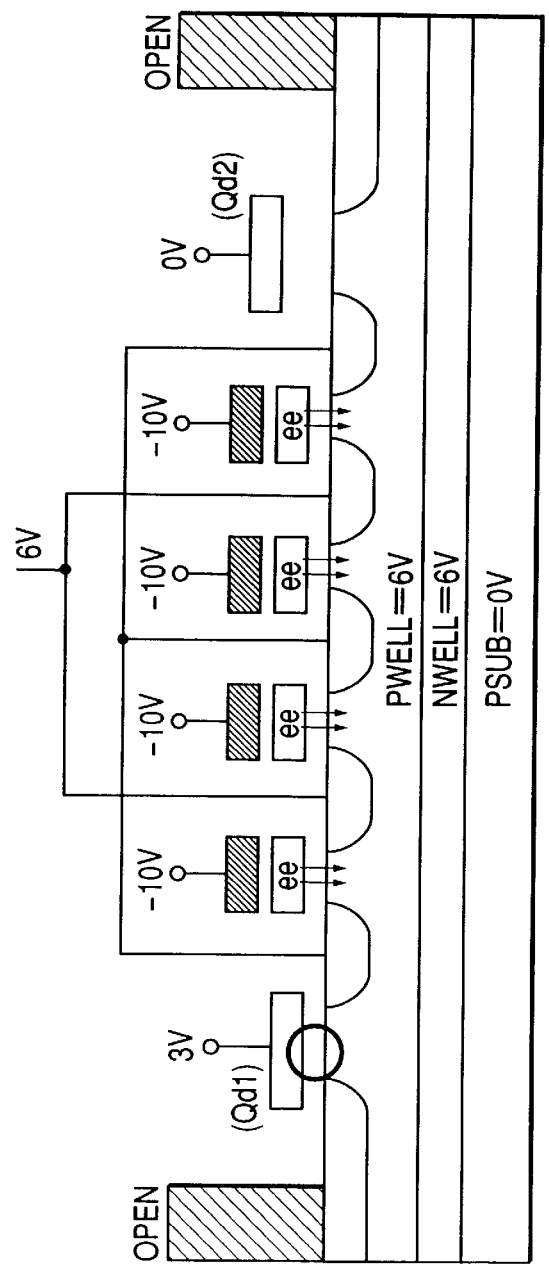
FIG. 7(A)
FIG. 7(B)

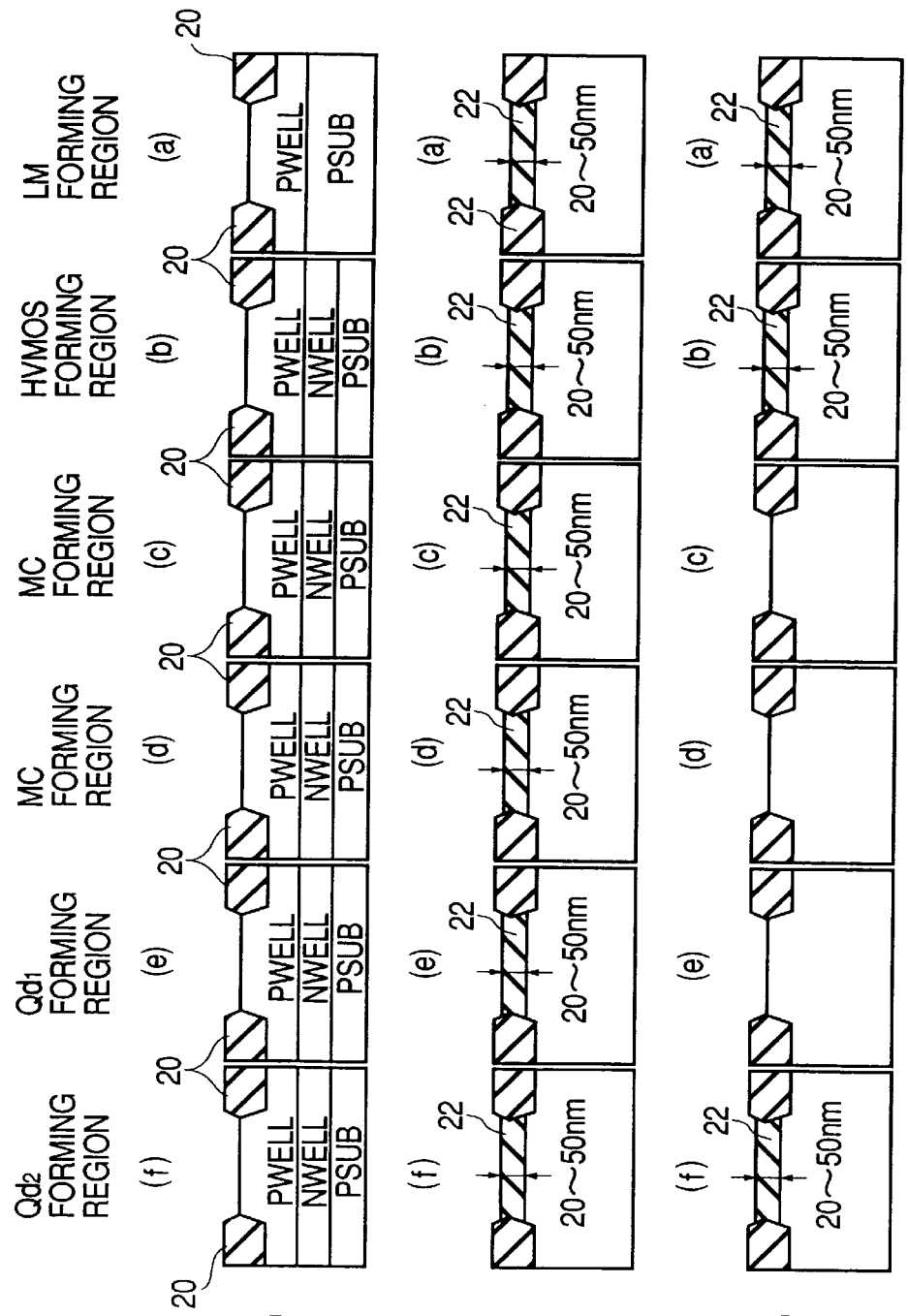

SEMICONDUCTOR INTEGRATED CIRCUIT DEVICE

This is a continuation application of U.S. Ser. No. 09/241,634, filed Feb. 2, 1999 U.S. Pat. No. 6,038,170.

INDUSTRIAL FIELD OF THE INVENTION

The present invention relates to a semiconductor integrated circuit device and, more particularly, to a semiconductor integrated circuit device such as a single-chip microcomputer having a nonvolatile memory.

BACKGROUND OF THE INVENTION

Flash EEPROMs (flash electrically erasable and programmable read only memories) are nonvolatile memories in which bit lines are divided and formed into a hierarchical structure. In this type of memory, a common row decoder is used to select word lines corresponding to the divided bit lines (sub-bit lines) so as to implement a highly concentrated word line makeup wherein memory contents may be erased in increments of blocks. One such flash EEPROM is disclosed illustratively in Japanese Published Unexamined Patent Application No. Hei 4-208566.

SUMMARY OF THE INVENTION

The divided sub-bit lines are connected to main bit lines through selection MOSFETs (metal-oxide-semiconductor field effect transistors). The selection MOSFET need to be dielectrically strengthened in order to carry high voltages that are applied to bit lines at times of write or erase operations. Enhancing the dielectric strength of the selection MOSFETs requires thickening their gate insulating films. Thicker gate insulating films necessarily involve higher levels of ON-state resistance. As a result, during precharging or discharging of sub-bit lines in preparation for a read operation or during a read operation based on the presence or absence of currents flowing through memory cells, the velocity of voltage changes on the sub-bit lines and main bit lines having relatively large parasitic capacitance can be restricted by a large ON-state resistance value of the selection MOSFETs.

The divided sub-bit lines are also described illustratively in "1995 IEEE International Solid-State Circuits Conference, pp. 122–123, 349 (1995)" and "1994 IEEE Journal of Solid-State Circuits, Vol. 29, No. 4, April, pp. 454–460 (1994)." A memory cell structure of flash EEPROMs is mentioned illustratively in "1987 IEDM Technical Digest, pp. 560–563 (1987)."

It is an object of the present invention to provide a semiconductor integrated circuit device having a nonvolatile memory of a hierarchical bit line structure that ensures high-speed operation. Another object of the present invention is to provide a semiconductor integrated circuit device having a nonvolatile memory of a hierarchical bit line structure which, while capable of fast operation, is nevertheless fabricated without additional production steps. Other objects, features and advantages of the present invention will become apparent in the following specification and accompanying drawings.

In carrying out the invention and according to one aspect thereof, there is provided a nonvolatile memory of a hierarchical bit line structure having hierarchical bit lines constituted by a plurality of sub-bit lines. Each sub-bit line is connected to an appropriate main bit line through a first and a second selection MISFETs, the first selection MISFET having a thin gate insulating film and used for read operations only, the second MISFET having a thick gate insulating film and used at least for write operations. In a write operation, the first selection MISFET has its drain or its gate supplied with a predetermined bias voltage so that the gate insulating film of the transistor will not be subjected to a voltage defeating the dielectric strength of the film.

BRIEF DESCRIPTION OF THE DRAWINGS

FIGS. 6A and 6B are schematic views explaining a write operation on the inventive FEEPROM;

FIGS. 7A and 7B are schematic views illustrating another erase operation on the inventive FEEPROM;

FIGS. 10A, 10B and 10C are partial cross-sectional views explaining steps to fabricate key elements in a semiconductor integrated circuit device according to the invention;

DESCRIPTION OF THE PREFERRED EMBODIMENTS

Figure 1:
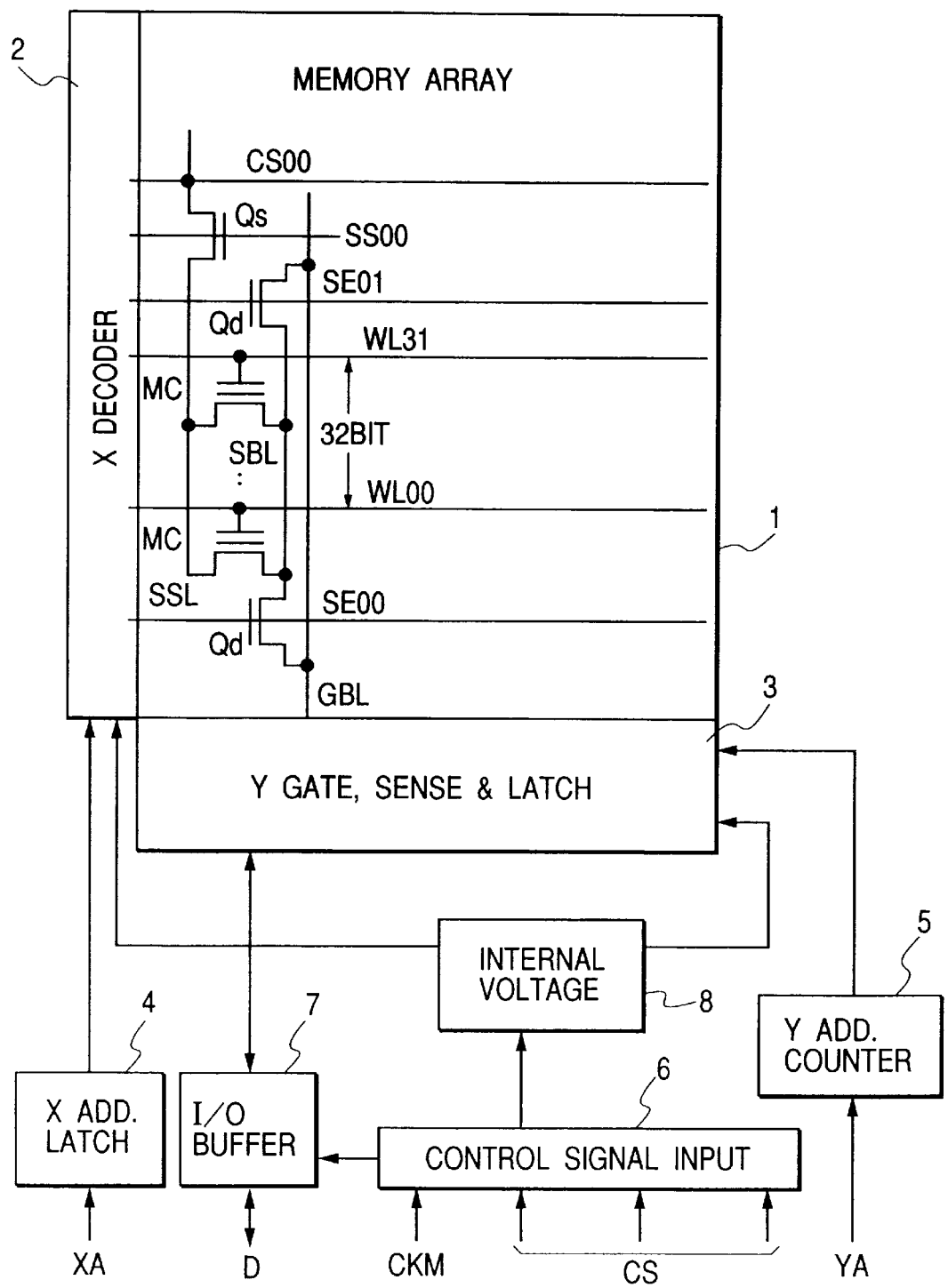
FIG. 1 is a schematic block diagram of an FEEPROM according to the invention.

FIG. 1 is a schematic block diagram of a flash EEPROM (simply called the FEEPROM hereunder) according to the invention. In this setup, an X address signal XA is fed to an X address buffer (indicated as "X Add Latch" in FIG. 1) 4. The address signal is latched by a latch circuit included in the address buffer 4. A Y address signal YA is supplied to a Y address buffer (Y Add Counter) 5. The Y address buffer 5 illustratively includes a counter and allows stored data of up to one word line to be read in synchronism with a clock signal CKM. A control signal input circuit (Control Signal Input) 6 determines an operation mode such as write, read or erase mode designated by the clock signal CKM and control signals, and generates timing signals necessary for the determined mode. In the description that follows, MOSFETs are assumed to signify generically not only metal-oxide-semiconductor field effect transistors but also metal-insulator-semiconductor (MIS) field effect transistors. It is also assumed that gate electrodes of the MOSFETs and MISFETs are made not only of metals but also of conductive polycrystal silicon.

A memory array 1 includes two word lines WL00 and WL 31, one main bit line GBL, one sub-bit line SBL, a pair of selection lines (main word line) SE00 and SE01 for selecting the sub-bit line SBL, and a source selection line SS00, all corresponding to a single memory block. At points of intersection between the word lines WL00 through WL31 on the one hand and the sub-bit line SBL on the other hand is a nonvolatile MOSFET memory cell (MC) in which are stacked control gates (electrodes) CG and floating gates (electrodes) FG. Illustratively, 32 memory cells MC corresponding to one memory block have their control gates connected electrically to 32 word lines WL00 through WL31. These memory cells MC have their drains (regions) commonly connected electrically to a single sub-bit line SBL extending perpendicularly to the drains. Sources (regions) of the memory cells MC are commonly connected electrically to the sub-source line SSL. The sub-bit line SBL connected electrically to the drains (regions) of the multiple memory cells MC constituting the memory block in question is also connected to the main bit line GBL via a pair of selection MOSFETs Qd. The common source (region) of the plurality of memory cells MC constituting the memory block is connected to a common source line CS00 via a selection MOSFET Qs. In this embodiment, word lines WL and control gates CG are integrally formed.

The X address signal XA input to the X address buffer 4 is forwarded to an X decoder (X Decoder) 2. Having decoded the address, the X decoder 2 selects one of the word lines of the memory array 1 accordingly. In a write, erase or read operation, the X decoder 2 illustratively generates signals for selecting the following: a pair of selection lines (main word lines) SE00 and SE01 connected to the gates of the selection MOSFETs Qd, the word lines WL00 through WL31 connected to the control gate of the memory cell MC, and the source selection SS00 corresponding to the selection lines SE00 and SE01. The voltages of these selection signals vary depending on the mode in effect, as will be described later. This function is implemented by the X decoder 2 using its output circuit for outputting voltage selection/nonselection levels corresponding to the respective operation modes. Voltages necessary in the operation modes are generated by an internal voltage generation circuit (Internal Voltage) 8.

The main bit line GBL is selected by a column switch (Y Gate) 3 before being connected to an input terminal of a sense amplifier. The sense amplifier senses a high/low level on the main bit line GBL connected to the selected memory cell MC with reference to a precharging potential on the nonselected main bit lines GBL to which the memory cell MC is not connected. This aspect of operation will be described later in more detail. On the output side of the sense amplifier is a latch circuit that latches the sense output. The main bit lines are furnished with precharging and discharging circuits, not shown, for read operations as will be described later.

The column switch 3 connects two main bit lines GBL to input/output terminals of the sense amplifier in accordance with a selection signal obtained by decoding the address signal from the Y address buffer 5. A Y decoder for gaining the selection signal is included in the column switch 3. The Y address buffer 5 acquires the designated address signal as a starting value and, using its counter, may generate address signals in synchronism with the clock signal CKM to perform consecutive read operations. A data terminal D is used to input and output data composed of a plurality of bits. Control signals are decoded by a control logic circuit in the control signal input circuit 6, and the control logic circuit accordingly establishes timing signals and voltages necessary for device operations.

Figure 2:
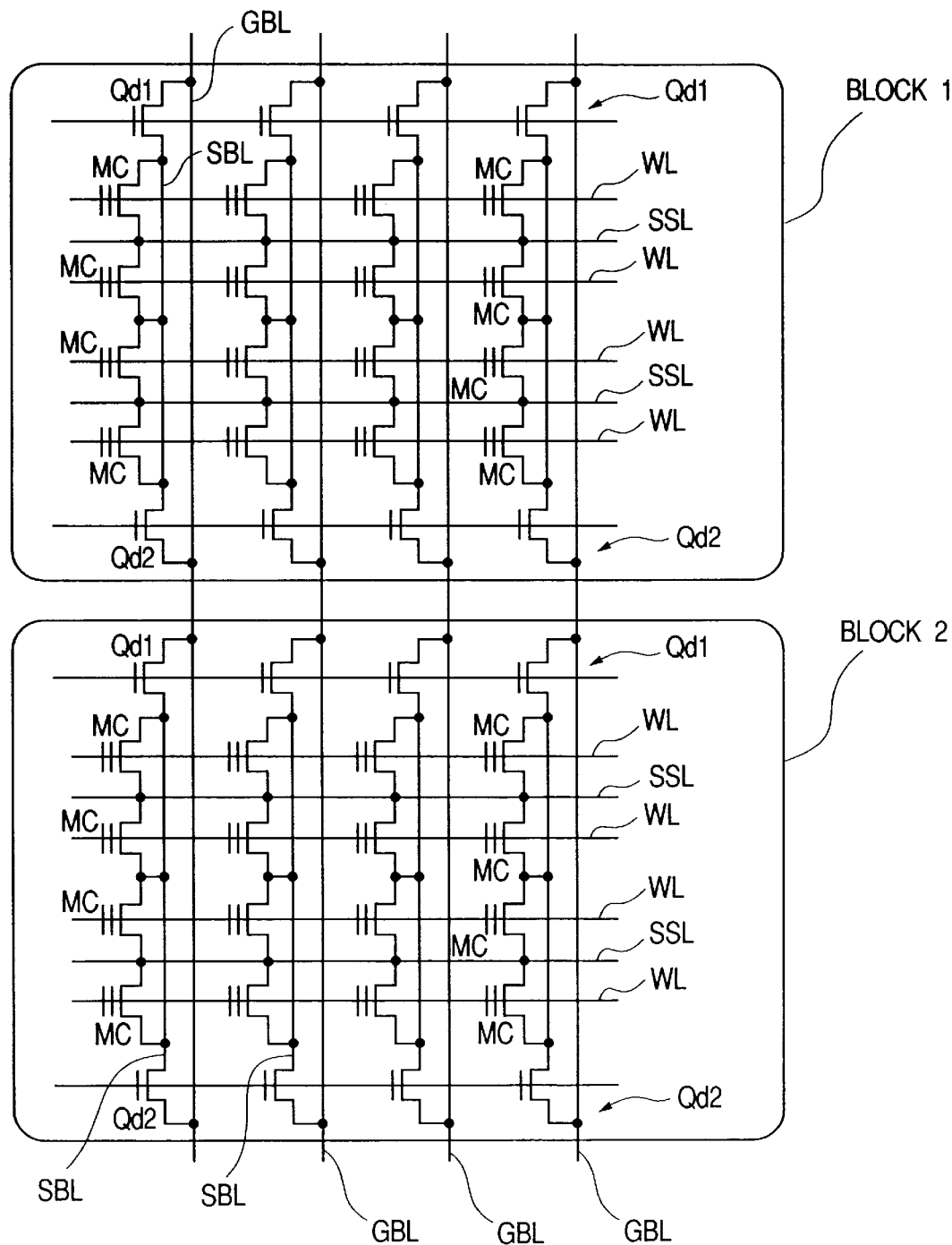
FIG. 2 is a circuit diagram of a memory array as part of an FEEPROM embodying the invention.

FIG. 2 is a circuit diagram of a memory array as part of an FEEPROM embodying the invention. FIG. 2 illustratively comprises two memory blocks each having four word lines WL, four main bit lines GBL and four sub-bit lines SBL. The four main bit lines GBL are common to the two memory blocks. That is, the two memory blocks are arranged in the extended direction of the main bit lines GBL.

The word lines WL arranged in groups in the two memory blocks are commonly supplied with, but not limited by, a selection signal from the X decoder for each group. This structure allows the word lines to be formed in a highly concentrated manner in line with a pitch of the memory cells MC. The X decoder furnished corresponding to the word lines is arranged to have a relatively large scale, i.e., large enough to output a plurality of selection/nonselection potential levels for write, erase and read operations, as will be described later.

In this embodiment, one sub-bit line SBL corresponds to a pair of selection MOSFETs 1 and 2 (transistors Qd1 and Qd2). The selection transistor 1 (Qd1), used only for read operations, has a relatively thin gate insulating film as is the case with the memory cell MC. On the other hand, the selection transistor 2 (Qd2), used for write and erase operations, has a thick gate insulating film to ensure high dielectric strengths so that a relatively high voltage on the main bit line GBL is conveyed selectively to the sub-bit line SBL. Sources S of the memory cells CM are connected commonly to, but not limited by, source lines SSL. In each block, the sources are connected to a common source line via a source selection switch MOSFET. In order to erase collectively data in each block, the circuit elements constituting the memory blocks are formed in well regions that are electrically isolated from one another.

Figure 3:
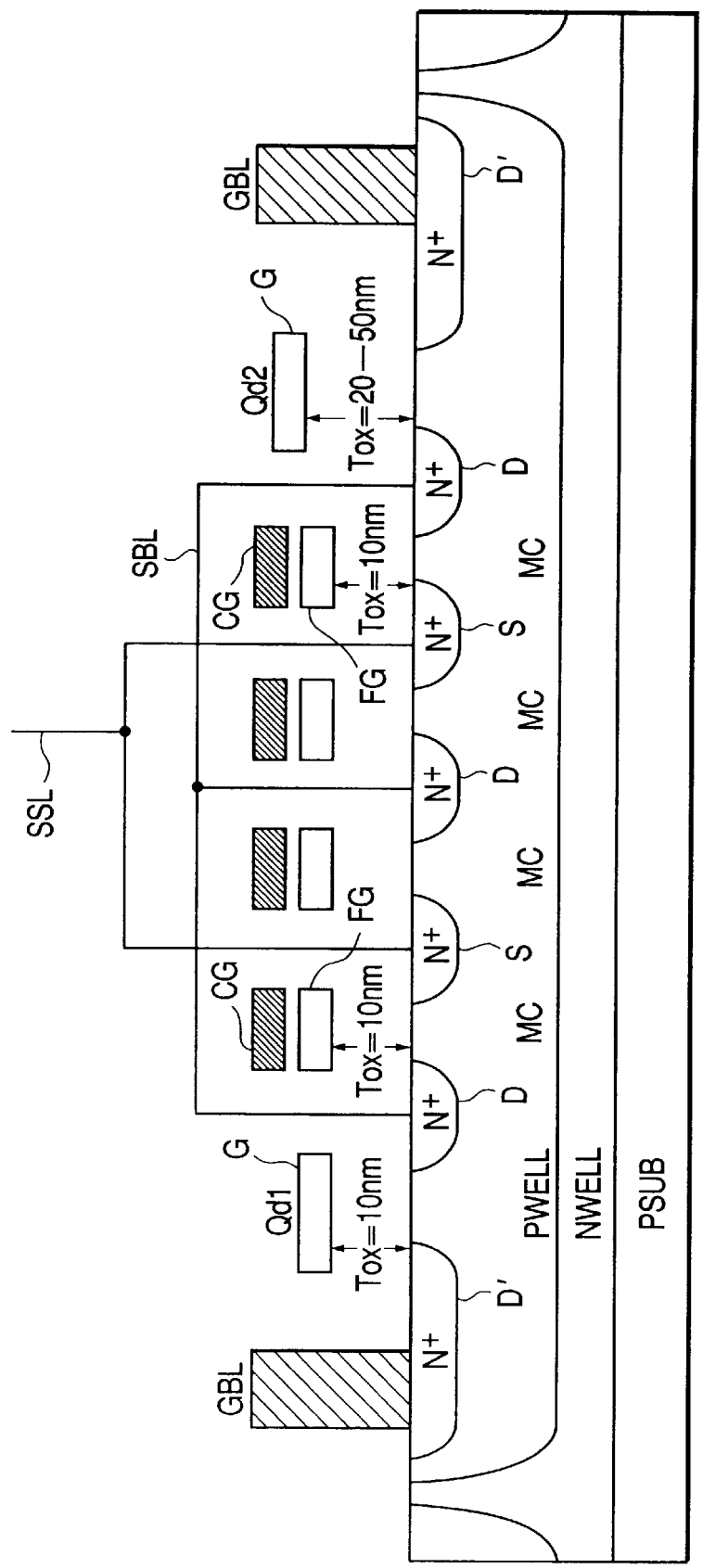
FIG. 3 is a schematic cross-sectional view of an element structure corresponding to a single sub-bit line in the embodiment of FIG. 2.

FIG. 3 is a schematic cross-sectional view of an element structure corresponding to a single sub-bit line SBL in the embodiment of FIG. 2. Deep N-type well regions NWELL are formed on a P-type semiconductor substrate PSUB. Within the N-type well regions, shallow P-type well regions PWELL are formed in units of memory blocks. This structure allows the well regions to be electrically isolated in increments of the blocks. Steps to fabricate a semiconductor integrated circuit device of the above makeup will be described later with reference to FIGS. 10A through 13E.

In each P-type well region are formed N-type diffusion layers (N-type semiconductor regions) S, D and D' constituting source and drain regions of the selection transistors 1 and 2 (QD1 and Qd2) and of a storage transistor forming each memory cell MC. The main bit line GBL is connected to one of the source and drain regions D, D' of the selection transistors 1 and 2 (Qd1 and Qd2). The other region of the paired source and drain regions D, D' of the selection transistors 1 and 2 (Qd1 and Qd2) is connected to the sub-bit line SBL to which the drain of the storage transistor constituting the memory cell MC is connected. The diffusion layers making up the source and drain regions S, D of the selection transistors 1 and 2 (Qd1 and Qd2) and of the storage transistor constituting each memory cell MC are illustratively formed in a single column. The source S of the selection transistor 1 (Qd1) is formed by a semiconductor region shared by the drain D of the storage transistor constituting the memory cell MC. In all other memory cells MC, the contiguous source regions S are formed by common N+ diffusion layers and so are the contiguous drain regions D. That is, every other memory cell MC has the sources and the drains formed alternately.

The memory cells MC are formed by MISFETs in a stacked gate structure. Each memory cell MC is primarily made up of a gate insulating film 24 form on a principal plane of the semiconductor substrate PSUB, a floating gate electrode FG on the gate insulating film 24, an interlayer insulating film 28 on the floating electrode FG, a control gate electrode (word line WL) CG on the interlayer insulating film 28, and diffusion layers S and D. The selection transistors Qd1 and Qd2 are primarily composed of a gate insulating film 22 formed on the principal plane of the semiconductor substrate PSUB, a gate electrode G on the gate insulating film 22, and diffusion layers D and D' serving as source and drain regions.

The gate insulating film 24 of the storage transistor making up each memory cell MC and the gate insulating film 24 of the selection transistor 1 (Qd1) are formed thin by the same process, as will be described later, illustratively to a film thickness (Tox) of 10 nm. On the other hand, the gate insulating film 22 of the selection transistor 2 (Qd2) is formed thick by a different process, illustratively to a film thickness (Tox) of 20 to 50 nm, appreciably thicker than the gate insulating film for the selection transistor 1 (Qd1). The thickened gate insulating film 22 is provided to ensure high dielectric strengths, i.e., to withstand high voltages fed to carry out write or erase operations.

Figure 4:
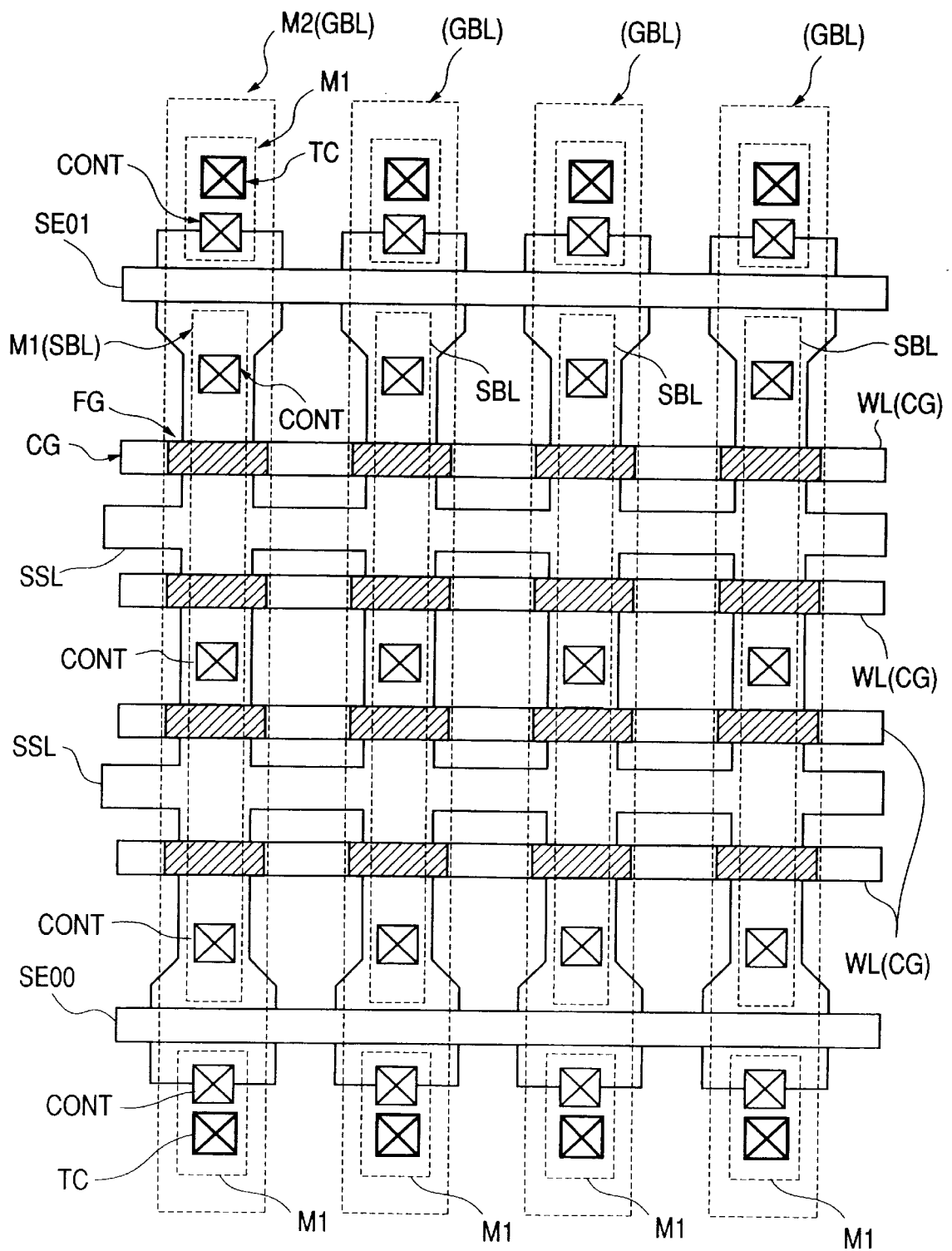
FIG. 4 is a plan view of an element pattern corresponding to a single block in the embodiment of FIG. 2.

FIG. 4 is a plan view of an element pattern corresponding to a single block in the embodiment of FIG. 2. In FIG. 4, four main bit lines GBL are formed by a metal wiring layer M2 as a second layer, the main bit lines extending longitudinally (i.e., in the bit line direction). Along the main bit lines GBL, there are sub-bit lines SBL formed by a metal wiring layer M1 as a first layer under the lines GBL. The main bit lines GBL and sub-bit lines SBL are intersected perpendicularly by sub-bit line selection lines (main word lines) SE01 and SE00, word lines WL, and source lines SSL, all extending crosswise (i.e., in the word line direction).

In the memory cell portion, each memory cell is furnished with a floating gate FG which is formed integrally with the control gate CG and which is shown block in the figure under the word line WL used commonly by the memory cells MC arranged linearly crosswise. The main word lines SE01 and SE00 and the floating gate FG are flanked by diffusion layers S and D acting as source and drain regions. These components make up the selection transistors Qd1 and Qd2 as well as the memory cells MC. The source diffusion layer S of each memory cell MC is shared illustratively by an adjacent memory cell MC extending crosswise. That is, the source diffusion layers S of the memory cells MC arranged contiguously crosswise are connected electrically through the source line SSL. The drains D of the memory cells MC are connected electrically through contact holes CONT to the sub-bit lines SBL formed by the metal wiring layer M1 as the first layer.

The drains D of the selection transistors Qd1 and Qd2 arranged at the upper and lower ends of each sub-bit line SBL are connected via the contact holes CONT, the metal wiring layer M1 as the first layer, and through holes TC, to the metal wiring layer M2 as the second layer constituting the main bit lines GBL. The drains D of the selection transistors Qd1 and Qd2 are connected via the contact holes CONT to the metal wiring layer M1 as the first layer making up the sub-bit lines SBL. The two source and drain regions D and D' of the selection transistors at the upper and lower ends of each sub-bit line are arranged symmetrically with respect to the memory cell portion. The floating gate FG of each memory cell MC, to be described later, is formed on the substrate PSUB with the gate insulating film 24 interposed therebetween. The control gate CG of each memory cell MC is formed on the floating gate FG with the interlayer insulating film 28 interposed therebetween. The word lines WL, the main word lines SE01 and SE00, and the source lines SSL are topped with the metal wiring layer M1 as the first layer with an interlayer insulating film interposed therebetween.

Figure 5:
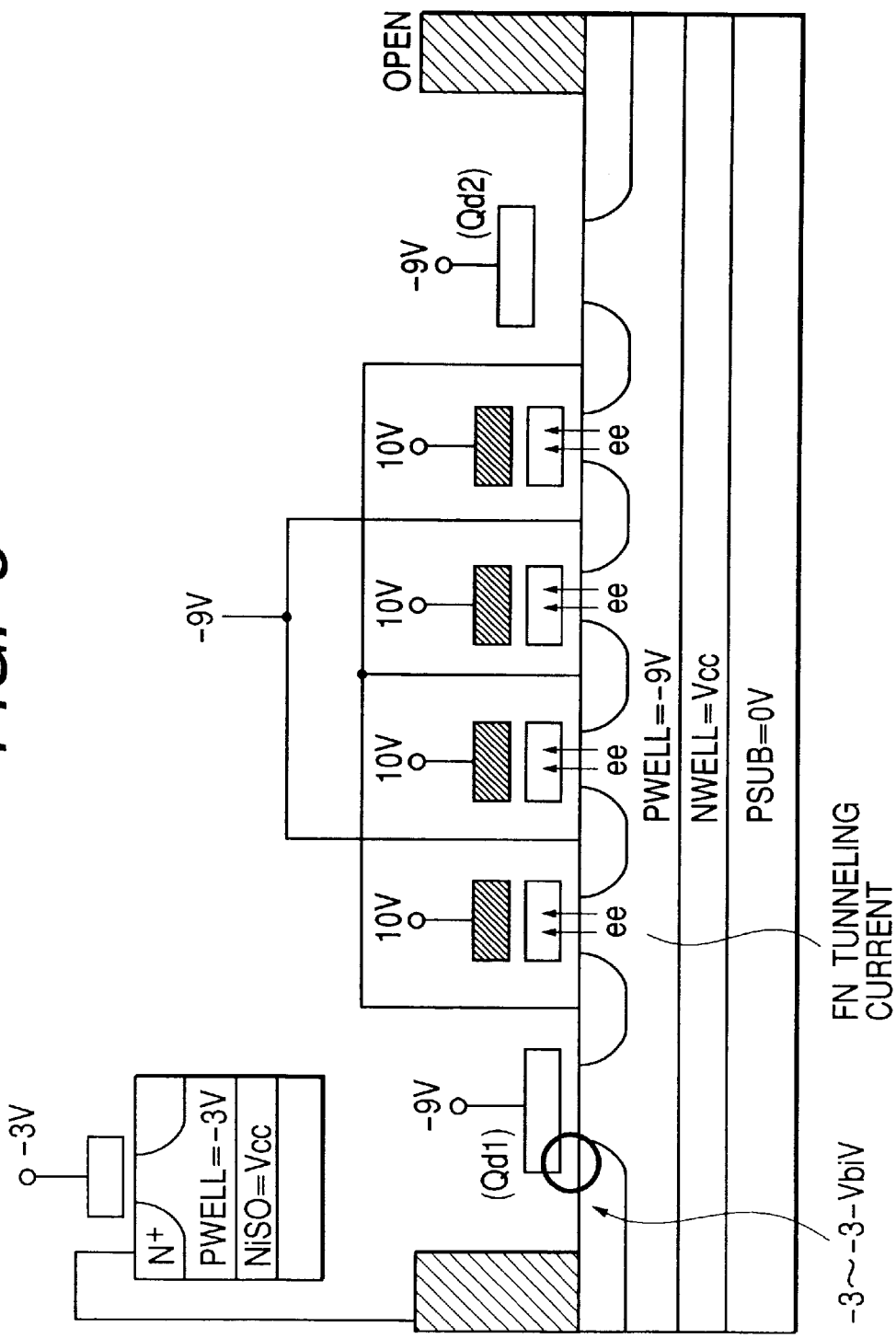
FIG. 5 is a schematic view depicting an erase operation on the invention FEEPROM.

FIG. 5 is a schematic view depicting an erase operation on the inventive FEEPROM. More specifically, FIG. 5 is a cross-sectional view of typical elements together with voltage indications specific thereto. In this inventive semiconductor integrated circuit device, a substrate PSUB is connected to the circuit ground potential of 0 V. A deep N-type well region NWELL is fed with a supply voltage Vcc. A P-type well region PWELL where the erase operation takes place is supplied with a voltage of −9 V. The word line WL to which the control gate CG is connected is supplied with +10 V. In this setup, the source S is supplied with the same voltage of −9 V as the P-type well PWELL. The gate G is given the voltage of −9 V so as to turn off the selection transistors 1 and 2 (Qd1 and Qd2). The main bit line GBL is left open.

The erase operation above is carried out in any one of block divided by the selection MOSFETs. The word lines WL of the block in question are fed with a high voltage of about 10 V. The P-type well in which each memory cell MC is formed and the source are supplied with a negative voltage of, say, −9 V. This causes the channel regions of the memory cells MC (formed by the P-type well PWELL) to be inverted to N-type, thereby forming an inversion layer. A FN (Fowler-Nordheim) tunneling current is allowed to flow by the tunnel effect from the P-type well (inversion layer) to the floating gate FG through the gate insulating film 24. The charges thus injected into the gate boost the threshold voltage. At this point, the memory cells MC are kept on by the word line WL1 being fed with 10 V. Supplying −9 V to the gates of the selection MOSFETs Qd1 and Qd2 turns off the transistors, which prevents the negative voltage −9 V of the source S from the being sent to the main bit line GBL. This allows the negative voltage to reach only the memory cells MC of the block to be erased, whereby the memory cells MC of the blocks not to be erased are freed from unnecessary stress.

In the above setup, the main bit line GBL is connected to the drain D' of the column switch. Conventionally, the P-type well PWELL comprising MOSFETs constituting the column switch is fed with 0 V. Supplying 0 V to the P-type well turns off the column switch, so that the main bit line GBL is left open and fed with the voltage of about 0 V. This requires making arrangements ensuring dielectric strength as high as that of the selection transistor 2 (Qd2). In this embodiment, by contrast, the selection transistor 1 (Qd1) has its gate insulating film 24 formed thin, so that the MOSFETs making up the column switch are isolated between wells. For an erase operation, the column switch MOSFETs are fed with −3 V and the gate is also supplied with −3 V. This brings the potential of the main bit line GBL to about −3 V and eases the voltage level on the gate insulating film 24 of the selection transistor 1 (Qd1) to about −6 V. Under such biased conditions, a depleted drain D' can result in a voltage drop of about 1 V. Thus the voltage actually applied to the gate insulating film 24 is about 5 V, which sufficiently prevents dielectric breakdown of the gate insulating film 24. In this case, the potential of the main bit line GBL is about −3 V as mentioned above, so that the P-type wells PWELL of the blocks not to be erased are subjected to the voltage of about −3 V. However, voltages of that level do not lead to inadvertent erasure and pose little problem.

FIGS. 6A and 6B are schematic views explaining a write operation on the inventive FEEPROM. More specifically, the two figures are cross-sectional views of typical elements together with voltage indications specific thereto. In FIG. 6A, the substrate PSUB is connected to the circuit ground potential of 0 V as mentioned in the preceding example. A deep N-type well region NWELL is fed with the supply voltage Vcc. A P-type well region PWELL of each memory block is supplied with a voltage of 0 V. A voltage of −9 V is fed to the word line WL connected to the control gate CG of each memory cells MC to which to write data. A voltage of 0 V is supplied to the nonselected word lines WL not subject to the write operation. At this point, the source S is left open. The gate G of the selection transistor 2 (Qd2) is fed with a selection voltage of 10 V, and the main bit line GBL is supplied with 6 V. The voltage of 0 V is fed to the gate G of the selection transistor 1 (Qd1), which turns off the transistor.

In the write operation above, the selected word line WL is fed with the negative voltage of −9 V while the nonselected word lines WL are supplied with 0 V. The voltage of 6 V on the main bit line GBL is fed via the selection transistor 2 (Qd2) to the sub-bit lines SBL connected to the memory cells MC to which to write data. By the tunnel effect involving a tunneling current, charges accumulated in the floating gate FG are led through the gate insulating film 24 into the drain diffusion layer D, whereby the threshold voltage is lowered. This selects the appropriate word line WL, leaving the nonselected sub-bit lines SBL open or connected to ground potential (0 V) to prevent generation of the tunneling current. In this write operation, the selection transistor 1 (Qd1) has the same potential as the P-type well PWELL, and the source and drain regions D and D' connected to the main bit line GBL are only fed with 6 V, whereby the dielectric breakdown of the gate insulating film 24 is prevented.

In FIG. 6B, the substrate PSUB is connected to the circuit ground potential of 0 V as mentioned above. The deep N-type well region NWELL is fed with the supply voltage Vcc. The P-type well region PWELL of each memory block is supplied with a voltage of 0 V. A voltage of 10 V is fed to the word line WL connected to the control gate CG of each memory cells MC to which to write data. A voltage of 0 V is supplied to the nonselected word lines WL not subject to the write operation. At this point, the source S is fed with 0 V. The gate G of the selection transistor 2 (Qd2) is fed with the selection voltage of 10 V, and the main bit line GBL is supplied with 6 V. The voltage of 0 V is fed to the gate G of the selection transistor 1 (Qd1), which turns off the transistor. In this setup, a channeling current is allowed to flow into the memory cells MC, generating hot electrons in the vicinity of the drain D. The hot electrons are led into the floating gate FG to raise the threshold voltage.

FIGS. 7A and 7B are schematic views illustrating another erase operation on the inventive FEEPROM. The erase operation of this example involves effecting a write operation using hot electrons (as shown in FIG. 6B) to discharge the floating gate FG, whereby the threshold voltage is lowered.

More specifically, FIG. 7A is a cross-sectional view of typical elements together with voltage indications specific thereto as depicted above. In this setup, the substrate PSUB is connected to the circuit ground potential of 0 V as described. The deep N-type well region NWELL is fed with the supply voltage Vcc. The P-type well region PWELL of the memory block to be erased is supplied with the voltage of 0 V. The appropriate word lines WL are fed with a negative voltage of −10 V, and the source S is supplied with 6 V. The gates G of the selection transistors 1 and 2 (Qd1 and Qd2) are fed with the nonselection voltage of 0 V. The main bit line GBL is left open.

In the erase operation above, the word lines WL are fed with the negative voltage of about −10 V, and the voltage of 6 V is supplied to the source diffusion layer S of each memory cell MC. This causes an FN tunneling current to flow, discharging the floating gate FG and lowering the threshold voltage. At this point, the gates G of the selection transistors 1 and 2 (Qd1 and Qd2) are supplied only with 0 V. Thus the P-type well PWELL comprising MOSFETs is fed with 0 V as is the case with conventional column switches. When the column switch is turned off to open the main bit line GBL, the latter bears a voltage of only about 0 V. This makes it possible to prevent dielectric breakdown of the gate insulating film 24 of the selection transistor 1 (Qd1).

FIG. 7B is another cross-sectional view of typical elements together with voltage indications specific thereto as depicted above. In this setup, the substrate PSUB is connected to the circuit ground potential of 0 V as mentioned. The deep N-type well region NWELL is fed with a voltage of 6 V. The source S and the P-type well region PWELL of the memory block to be erased are also supplied with 6 V. The appropriate word lines WL are fed with a negative voltage of −10 V. The gates G of the selection transistors 1 and 2 (Qd1 and Qd2) are fed with the nonselection voltage of 0 V. The main bit line GBL is left open.

In the erase operation above, the word lines WL are fed with the negative voltage of about −10 V, and the voltage of 6 V is supplied to the source of each memory cell MC and to the P-type well region PWELL. This causes an FN tunneling current to flow, leading the charges of the floating gate FG into the P-type well side and lowering the threshold voltage. At this point, the gate G of the selection transistor 1 (Qd1) is supplied with an intermediate voltage of, say, 3 V, and the gate G of the selection transistor 2 (Qd2) are fed with 0 V. It follows that as with conventional column switches, the P-type well PWELL comprising MOSFETs is supplied with 0 V and the main bit line GBL made open by the column switch being turned off is only subjected to about 0 V. Because the gate insulating film 24 of the selection transistor 1 (Qd1) is fed only with about 3 V, dielectric breakdown does not take place.

Figure 8A:
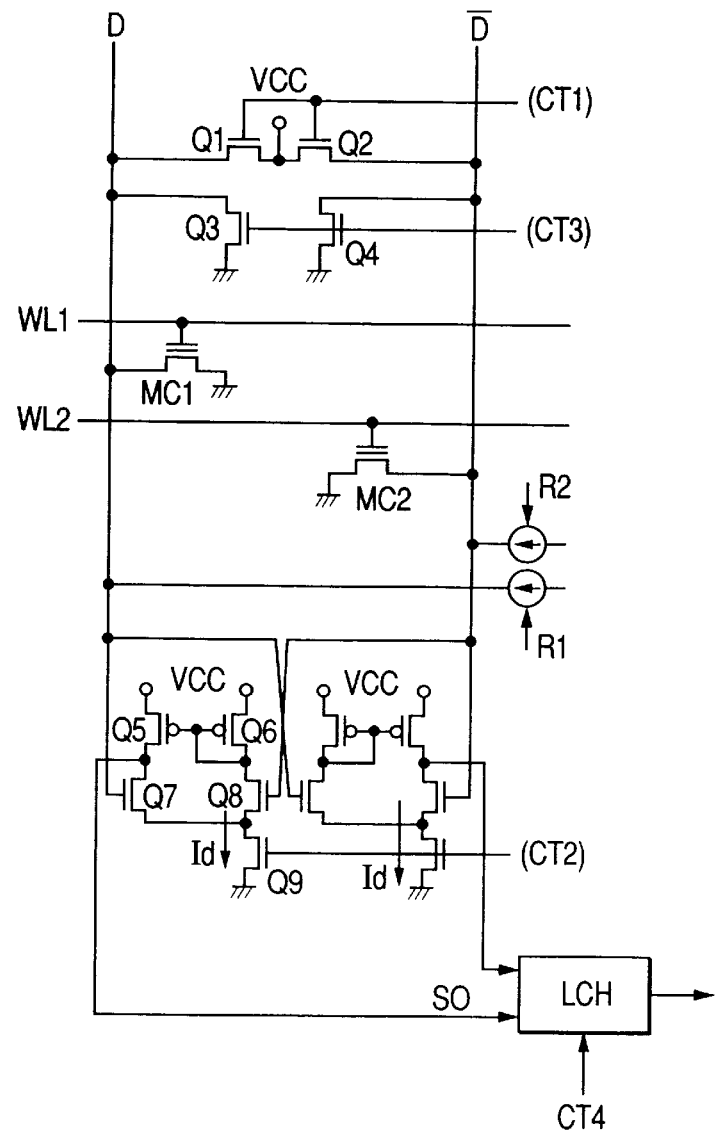
FIGS. 8A and 8B are schematic views showing a read operation on the FEEPROM of FIG. 2.
Figure 8B:
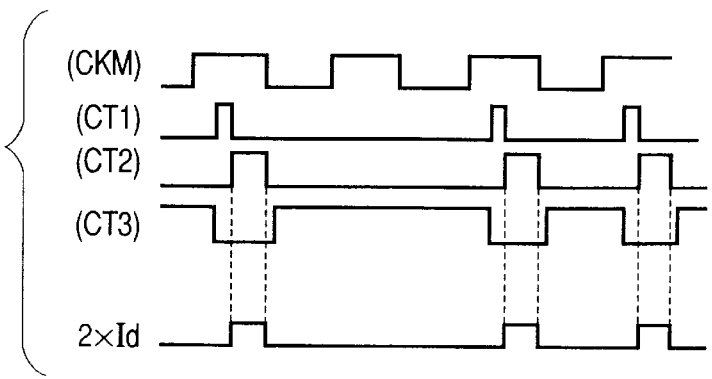

FIGS. 8A and 8B are schematic views showing a read operation on the FEEPROM of FIG. 2. FIG. 8A illustrates paired bit lines D and /D, word lines WL1 and WL2, memory cells MC1 and MC2, and sense amplifiers. This figure omits main bit lines GBL, sub-bit lines SBL, selection MOSFETs and column switches such as those shown in FIG. 2.

Precharging and discharging the floating gates FG for a write or an erase operation causes the memory cells MC1, etc., to have a threshold voltage higher or lower than the selection level of the word lines WL. For example, when the word line WL1 is set to the selection level in order to get a read signal from the memory cell MC1 onto the bit line D, the paired bit line /D is also selected by the column switch. A read current source corresponding to the selected bit line D is then turned on by a signal R1 to inject a read current. As a result, if the threshold voltage of the memory cell MC1 is lower than the selection level of the word line WL1 so that the cell is on, then the potential of the bit line D is brought Low with respect to the precharging voltage despite the supply of the read current.

On the other hand, if the threshold voltage of the memory cell MC1 is higher than the selection level of the word line WL1 so that the cell is off, the read current source activated by the signal R1 is allowed to feed a current that drives the potential of the bit line D High with respect to the precharging voltage. At this point, the read current to the bit line /D is turned off by a signal R2 to keep the bit line /D to the precharging voltage. As a result, the high level of the selected data line D changes with reference to the precharging voltage of the data line /D. The high and low levels of the bit line D are amplified by two single-ended differential amplifiers turned on by a sense amplifier active signal (CT2).

The data lines D and /D are furnished with precharging MOSFETs Q1 and Q2. A precharging signal (CT1) causes the precharging MOSFETs Q1 and Q2 to precharge the data lines D and /D up to the supply voltage Vcc. The data lines D and /D are also provided with discharging MOSFETs Q3 and Q4. A discharging signal (CT3) causes the discharging MOSFETs Q3 and Q4 to discharge the data lines D and /D down to the circuit ground potential.

As shown in FIG. 8B, when the discharging signal CT3 is brought Low from High to turn off the MOSFETs Q3 and Q4 completing a discharging operation, the precharging signal CT1 is driven High from Low to turn on the MOSFETs Q1 and Q2. This sets the data lines D and /D to the same precharging voltage level that varies from the discharging level (such as circuit ground potential) toward the supply voltage Vcc. If the period of the precharging signal CT1 is prolonged, the data lines D and /D are set to a supply voltage Vcc−Vth (Vth is the threshold voltage of the precharging MOSFETs).

When the precharging signal CT1 is driven Low from High to complete the precharging operation above, the sense amplifier active signal CT2 is brought High from Low to activate the sense amplifiers. At the same time, the read current flows on the selected data line D. This results in a potential difference between the data lines D and /D representing stored data in the memory cell MC1. The differential is amplified by the sense amplifiers.

A current Id keeps flowing in the sense amplifier operation above. This means that if the sense amplifiers are left to operate for an extended period of time, a direct current (2×Id) will flow continuously leading to increased power dissipation. This problem is circumvented by the embodiment controlling the high-level period of the sense amplifier active signal CT2 so that the sense amplifier operation is terminated upon acquisition of an amplification signal necessary for activating a latch circuit LCH on the output side. With the sense amplifier active signal CT2 brought Low, the discharging signal CT3 is driven High to discharge the data lines D and /D down to the low level such as the circuit ground potential. The latch circuit LCH latches the sense amplifier output (sense output SO) when the sense amplifier active signal is driven High prior to the timing signal T3.

Elements inside memory arrays are generally laid using techniques ensuring the smallest possible processing sizes of the current generation of processing. For that reason, it is difficult to reduce area components representing the parasitic capacity of the main bit lines GBL and sub-bit lines SBL. To reduce the parasitic capacity requires thickening of films between wiring and the substrate or decreasing the junction capacitance of MOSFETs by resorting to such measures as additional implementation of ion implantation processes. However, greater film thicknesses entail larger contact aspect ratios which render the processing more different than before. The additional ion implantation processes further increase the number of the processing steps involved. Even if these measures are implemented. The parasitic capacity is reduced by only 10 to 20 percent.

Meanwhile, the ON-state resistance value of the selection transistor 1 (Qd1) determining the discharging time of the main bit lines GBL and sub-bit lines SBL may be reduced to about half the ON-state resistance value of the selection transistor 2 (Qd2). Because the selection transistor 1 (Qd1) acts in linear regions, a drain current Ids is defined as $$Ids = (½) \cdot (W/L) \cdot \mu \cdot Cox \cdot (2(Vg-Vth) \cdot Vd - Vd^2) \qquad (1)$$

where W stands for a channel width, L for a channel length, $\mu$ for the mobility of electrons, Cox for the gate capacity per unit area, Vth for a threshold voltage, Vg for a gate voltage, and Vd for a drain voltage. The gate capacity Cox is defined as $$Cox = \epsilon r \cdot \epsilon ox / Tox$$

where $\epsilon r$ stands for the relative dielectric constant of oxide films, $\epsilon ox$ for the dielectric constant in a vacuum, and Tox for the thickness of a gate oxide film.

It follows that when the source potential is 0 V, the ON-state resistance value R of the MOSFETs is defined as $$R = Vd/Ids = Vd/((½) \cdot (W/L) \cdot \mu \cdot Cox \cdot (2(Vg-Vth) \cdot Vd - Vd^2)) \qquad (2)$$

If it is assumed simply that Vd=1V and Vg=3V (Vcc), then the ON-state resistance value R of the MOSFETs is defined as $$R = 2/(W/L) \cdot \mu \cdot (\epsilon r \cdot \epsilon ox/Tox) \cdot (2(3-Vth)-1)) \qquad (3)$$

Thus the ON-state resistance value of the selection transistor 1 (Qd1) may be reduced by making the value W greater and L, Tox and Vth smaller. The values $\mu$ and $\epsilon ox$ are specific to the material being used, and $\epsilon o$ is a physical constant. The value W is determined by the crosswise size of a memory cell as shown in FIG. 4, and L and Vth are determined by a punch-through withstand voltage in effect at the time of erasure. The Tox is defined by the voltage fed to the gate oxide film at the time of an erase or a write operation.

This embodiment comprises a pair of selection transistors, one of which (selection transistor 2 (Qd2)) has its gate oxide film formed as thick as that of conventional selection transistors for use in erase and write operations. The other selection transistor 1 (Qd1), used only for read operations, has its gate oxide film formed thin. In that case, the ON-state resistance values R2 and R1 for the two transistors are defined as follows:

$$R2=2/(W/L)\cdot \mu \cdot (\epsilon r \cdot \epsilon ox/Tox2)\cdot (2(3-Vth2)-1)) \quad (4)$$

$$R1=2/(W/L)\cdot \mu \cdot (\epsilon r \cdot \epsilon ox/Tox1)\cdot (2(3-Vth1)-1)) \quad (5)$$

The ratio of the value R1 to the value R2 is defined as $$R1/R2=(L1/L2)\cdot (Tox1/Tox2)\cdot (3-Vth2)/(3-Vth1) \quad (6)$$

where L1 and Vth1 are determined by the punch-through withstand voltage in effect for write operations, and L2 and Vth2 are determined by the punch-through withstand voltage in effect for erase operations. Generally, the punch-through withstand voltage for write operations (typically 6 V) is lower than that for erase operations (typically 9 V). It is thus possible to ensure the relations L1<L2 and Vth1<Vth2. The value Tox 1 is made smaller than Tox2 when the drain or gate is biased as described earlier so as to prevent the supply of a high voltage to the gate oxide film upon write or erase operation.

Illustratively, it is known for the 0.35 μm process generation that Tox1=10 nm, L1=0.7 μm, Vth1=0.4 V, Tox=20 nm, L2=0.9 μm, and Vth2=0.5 V. Inserting these values into the expression (6) above yields the ratio (R1/R2) of 0.374. That is, whereas the conventional setup involves having the paired selection transistors both prepared to have high dielectric strengths, only one of the two selection transistors in this embodiment is designed to offer enhanced dielectric strength and the other transistor is used only for read operations. In such a comparative case, the ratio of the combined resistance of R1 and R2, to the combined resistance of R1 and R1 is about 0.54, i.e., about half the conventional resistance. If only one selection transistor is used together with its enhanced dielectric strength, the resistance may be reduced by as much as three-fourths.

Given the arrangements described above, the precharging period of the sub-bit lines SBL initiated by the signal CT1 may be shortened in the read operation above. At a sense amplifier read time, signal changes on the main bit lines may be accelerated while the discharging period of the sub-bit lines initiated by the signal CT3 is reduced. When the period of the clock signal CKM is shortened in the above manner, the operating speed is improved.

Figure 9A:
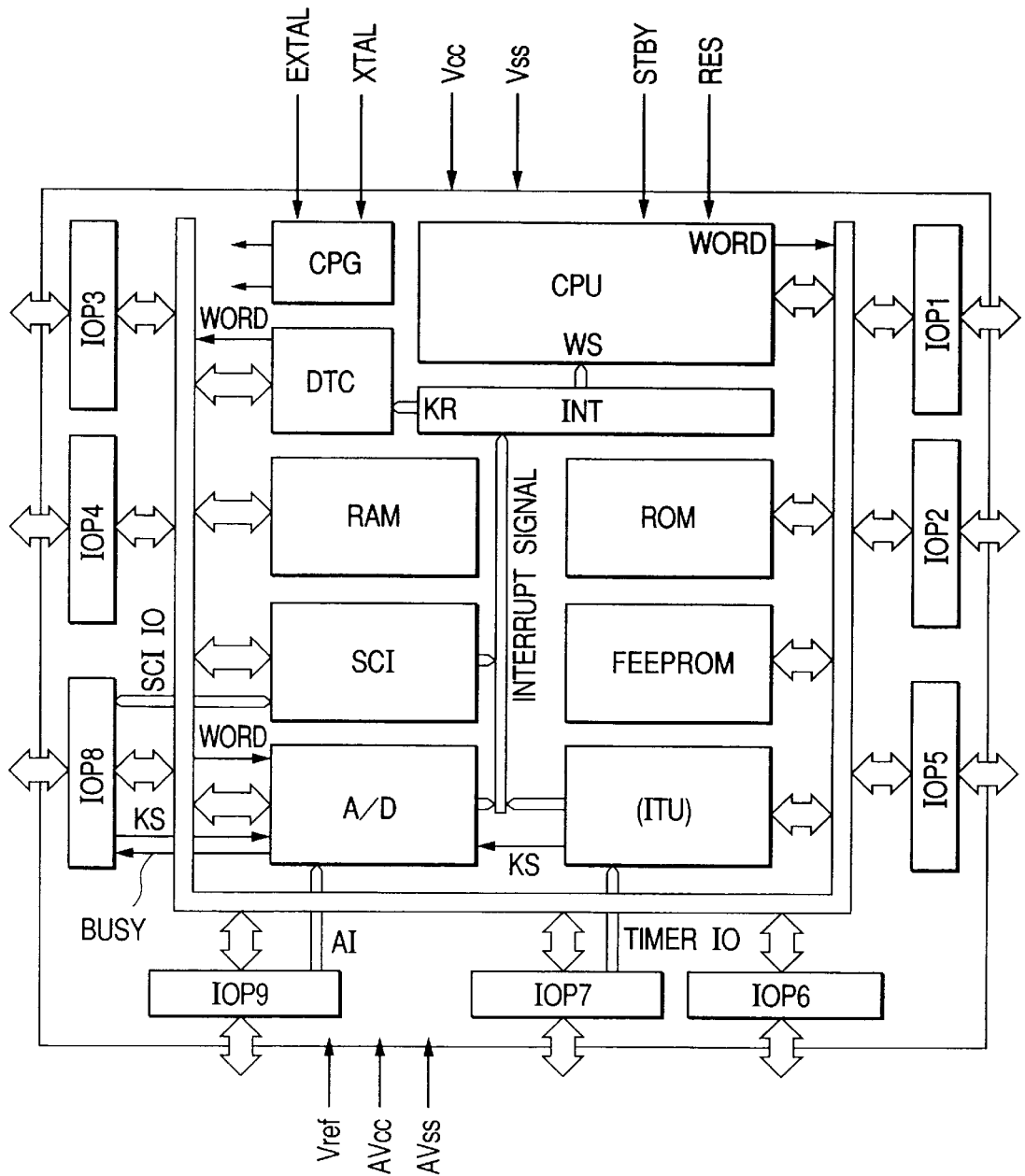
FIG. 9A is a block diagram of a single-chip microcomputer to which this invention is applied.

FIG. 9A is a block diagram of a single-chip microcomputer to which this invention is applied. Each of the circuit blocks in FIG. 9A is formed on one semiconductor substrate illustratively made of single crystal silicon by semiconductor integrated circuit device fabrication techniques.

The single-chip microcomputer as embodied here comprises: a central processing unit CPU (logic circuit), clock pulse generator CPG, a data transfer controller DTC, an interrupt controller INT, a read-only-memory (ROM) containing programs and other resources, a random access memory RAM used for temporary data storage and other purposes, an FEEROM such as one described above and used as a nonvolatile memory for storing data and others, a timer ITU, a serial communication interface SCI, an analog-digital (A/D) converter, and function blocks or modules constituting I/O ports IOP1 through IOP9. The random access memory RAM may be constituted by a DRAM (dynamic random access memory).

Figure 9B:
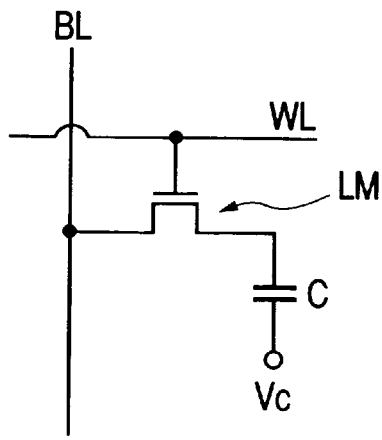
FIG. 9B is an equivalent circuit diagram showing a memory cell of a DRAM.
Figure 9C:
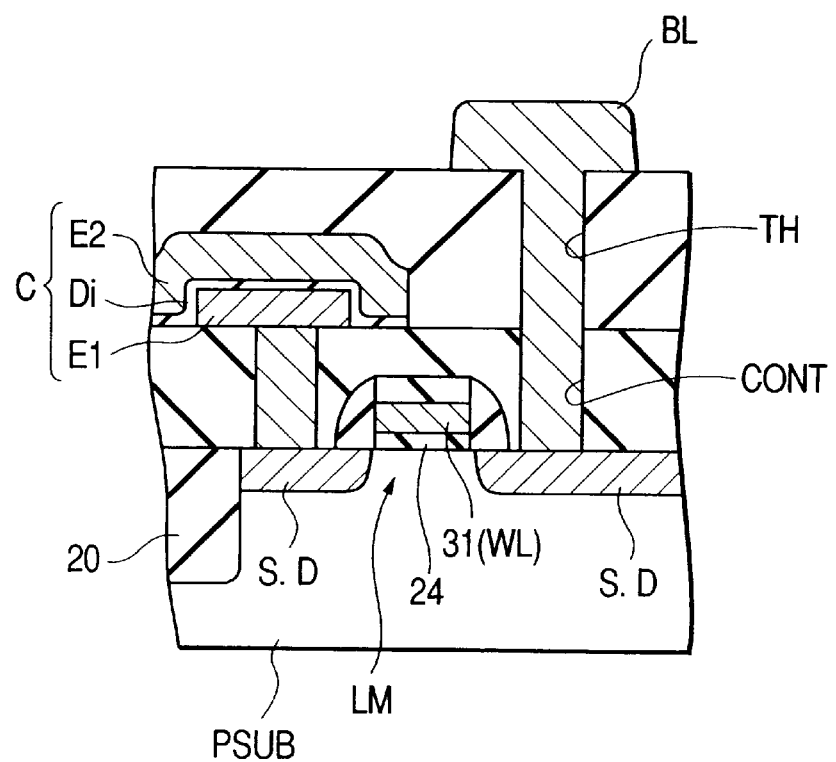
FIG. 9C is a partial cross-sectional view of a memory cell of a DRAM.

As shown in FIGS. 9B and 9C, memory cells in the DRAM are each made illustratively of an MOSFET (LM) and a capacitative element C. The MOSFET (LM) has a gate insulating film 24 formed thin by use of the same process as that for the gate insulating film 24 of the selection transistor Qd1. The capacitative element C is connected electrically to one of the source and drain regions (S, D) of the MOSFET (LM). This memory cell structure improves DRAM performance. The performance is also improved when the MISFETs making up the memory cells of the DRAM are constituted by MISFETs having the same MIS structure as the MOSFETs (LM) constituting the logic circuits such as the CPU.

One electrode E1 of the capacitative element C is connected electrically to one of the source and drain regions (S, D) of the MOSFET (LM). The other electrode E2 of the capacitative element C is supplied with a predetermined voltage Vc. A dielectric film Di is formed between the two electrodes of the capacitative element C. A gate electrode 31 of the MOSFET (LM) is formed on the gate insulating film 24 in integral relation with the word line WL. The source and drain regions (S, D) of the MOSFET (LM) are formed in the semiconductor substrate PSUB. The other source or drain region than the one mentioned above is connected electrically to the bit line BL. This type of microcomputer is described illustratively in U.S. Pat. No. 5,057,448. All contents of that patent are incorporated herein by reference.

The function blocks or modules above are interconnected by an internal bus structure that includes an address bus, a data bus and a control bus for transmitting read and write signals. The control bus may also carry a bus size signal (WORD) and/or a system clock signal. Read and write operations on these blocks or modules are performed by the central processing unit CPU or by the data transfer controller DTC. The internal bus structure is illustratively 16 bits wide.

The single-chip microcomputer of this embodiment includes as its power terminals a ground potential terminal Vss, a power supply terminal Vcc, an analog ground potential terminal AVss, an analog supply voltage terminal AVcc, and analog reference voltage terminal Vref. As its dedicated control terminals, the single-chip microcomputer comprises a reset terminal RES, a standby terminal STBY, mode control terminals MD0 and MD1, and clock input terminals EXTAL and XTAL.

The I/O ports double as I/O terminals for use by the address bus, the data bus, bus control signals, the timer ITU, the serial communication interface SCI, and the A/D converter. The timer, serial communication interface SCI and the A/D converter have their own I/O signals exchanged with the outside through the I/O ports that double as the I/O terminals.

A compare match signal of the timer, an overflow signal and an underflow signal are each fed as a seizing signal KS (A/D conversion start trigger) to the A/D converter A/D. An interrupt signal WS is output by the A/D converter, timer or serial communication interface SCI. Upon receipt of the interrupt signal WS, the interrupt controller INT sends an interrupt request signal to the central processing unit CPU or feeds a start request signal to the data transfer controller DTC depending on designated provisions such as a register name. Switchover between the two signals is effected by use of a predetermined bit of the interrupt controller.

The data transfer controller DTC should preferably be capable of transferring a plurality of units of data in a single operation in what is called block transfer mode. The controller DTC comprises a source address register, a destination address register, a block size counter, a block size register and a block transfer counter whereby data are transferred in units of blocks.

Single-chip microcomputers of the above-mentioned 0.35 μm process generation operate at a frequency of 60 MHz;

one-chip microcomputers of the next 0.25 μm process generation are expected to operate at a frequency of 100 MHz. Thus to read data from the internal FEEPROM in a single cycle requires that the read rate be 1/f (f is the above-mentioned operating frequency) or less. For example, it is required that 16.7 ns or less at the operating frequency of 60 MHz, or 10 ns or less at 100 MHz. For the FEEPROM to operate at such high speeds, it is mandatory to shorten the above-mentioned precharging and discharging periods. One effective way to implement the above type of memory is by combining the selection transistors 1 and 2. The combined use of the paired selection transistors helps realize an FEEPROM that meets the above requirements without increasing the number of process steps or lowering the degree of circuit integration.

FIGS. 10A through 13E show cross-sectional views illustrating ways to fabricate key elements of a semiconductor integrated circuit device according to the invention. In FIGS. 10A through 13E, each subfigure (a) shows a region wherein are formed logic MOSFETs (LM) constituting a logic circuit portion such as a central processing unit CPU and an address decoder; each subfigure (b) depicts a region wherein peripherally located dielectrically reinforced MOSFETs (HVMOS) are formed; each subfigure (c) indicates a region wherein memory cells MC are formed in the word line direction; each subfigure (d) sketches a region wherein memory cells MC are formed in the bit line direction; each subfigure (e) illustrates a region wherein the selection transistor (MOSFET) 1 (Qd1) having a thin gate oxide film 24 is formed; and each subfigure (f) shows a region wherein the selection transistor (MOSFET) 2 (Qd2) having a thick gate oxide film 22 is formed. As mentioned above, the MISFETs making up the memory cells of the DRAM are constituted by logic MOSFETs (LM).

The selection MOSFETs (f) and (e), the memory cells MC (d) and (c), and the peripherally located dielectrically reinforced MOSFETs (b) are formed in P-type well regions PWELL formed in deep N-type well regions NWELL. The logic MOSFETs (a) are formed in a P-type well region PWELL formed on a P-type substrate PSUB. The selection MOSFETs (f) and (e), the memory cells (d) and (c), and the peripherally located dielectrically reinforced MOSFETs (b) are arranged in a dual layer gate structure. The gates in the first and the second layer of the selection MOSFETs and of the dielectrically reinforced MOSFETs are connected by a metal wiring layer, as will be described later with reference to FIG. 14.

FIG. 10A is a cross-sectional view in effect after a field oxide film 20 (element insulating film) and wells have been formed. In the cross-sectional views subsequent to FIG. 10A, the N-type well region NWELL and P-type well region PWELL on the semiconductor substrate side are omitted.

As shown in FIG. 10B, sacrificial oxidation is carried out for channel doping of the selection MOSFETs (f) and (e), the memory cells (d) and (c), and the peripherally located dielectrically reinforced MOSFETs (b). Then gate oxidation (e.g., of 20 to 50 nm) such as thermal oxidation is conducted to form the gate insulating film 22 composed of a silicon oxide film ($SiO_2$) having a film thickness of 20 to 50 nm.

As depicted in FIG. 10C, gate photo-etching is performed to remove the gate oxide film 22 from the regions in which are formed the selection MOSFET (e) having the thin gate oxide film and the memory cells (d) and (c).

Figure 11A:
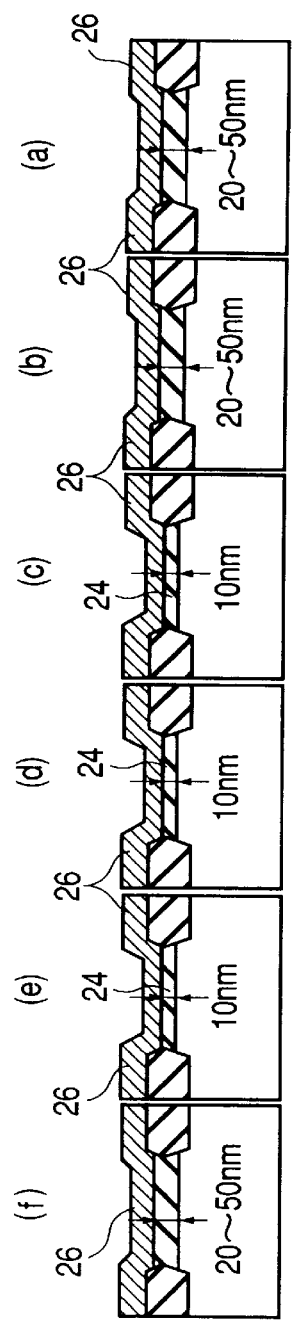
FIGS. 11A and 11B are other partial cross-sectional views illustrating steps to fabricate key elements in the inventive semiconductor integrated circuit device.

As illustrated in FIG. 11A, the gate insulating film 24 made of a silicon oxide film about 10 nm thick is formed illustratively by thermal oxidation in order to effect tunnel oxidation (e.g., of 10 nm). Later, a polysilicon film 26 is deposited by the CVD method.

Figure 11B:
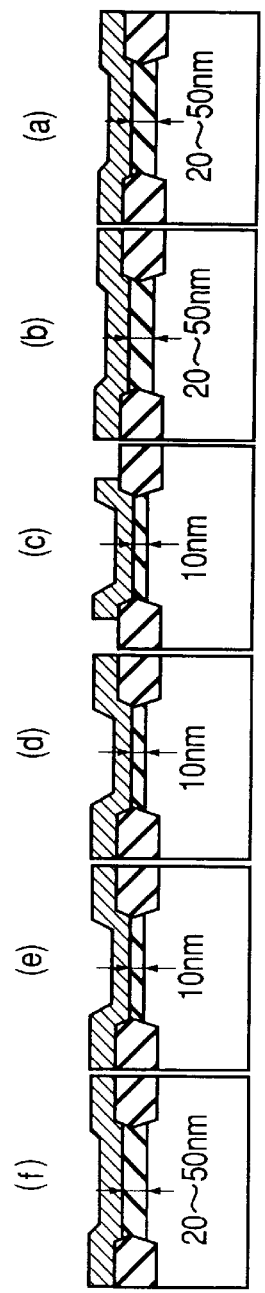

As indicated in FIG. 11B, the floating gates FG of the memory cells (d) and (c) are patterned.

Figure 12A:
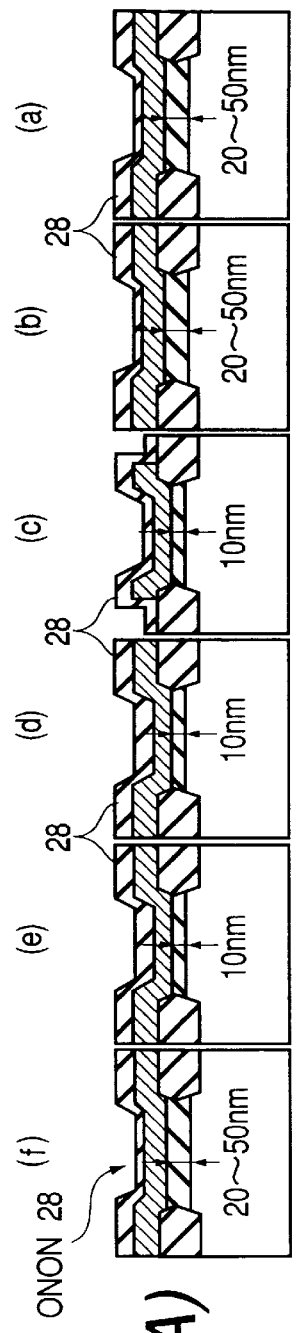
FIGS. 12A, 12B and 12C are further partial cross-sectional views depicting steps to fabricate key elements in the inventive semiconductor integrated circuit device.

As shown in FIG. 12A, a silicon oxide film is deposited by thermal oxidation or by the CVD method. With the silicon oxide film thus deposited, a silicon nitride ($Si_3N_4$) film is deposited by the CVD method. An oxide film is further deposited by thermal oxidation or by the CVD method. Thereafter, another $Si_3N_4$ film is deposited by the CVD method to form eventually an ONON film 28.

Figure 12B:
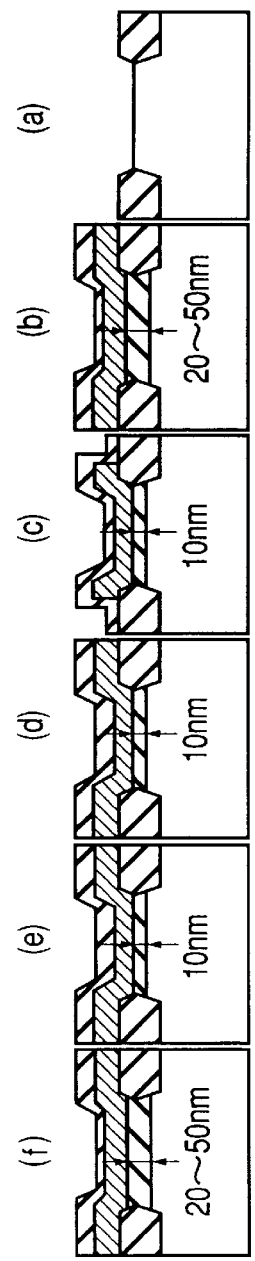

As depicted in FIG. 12B, photo-etching (dry etching) is carried out to remove the ONON film 28 and polysilicon film 26 from the logic MOSFETs (a). Then the gate insulating film 22 is removed by wet etching.

Figure 12C:
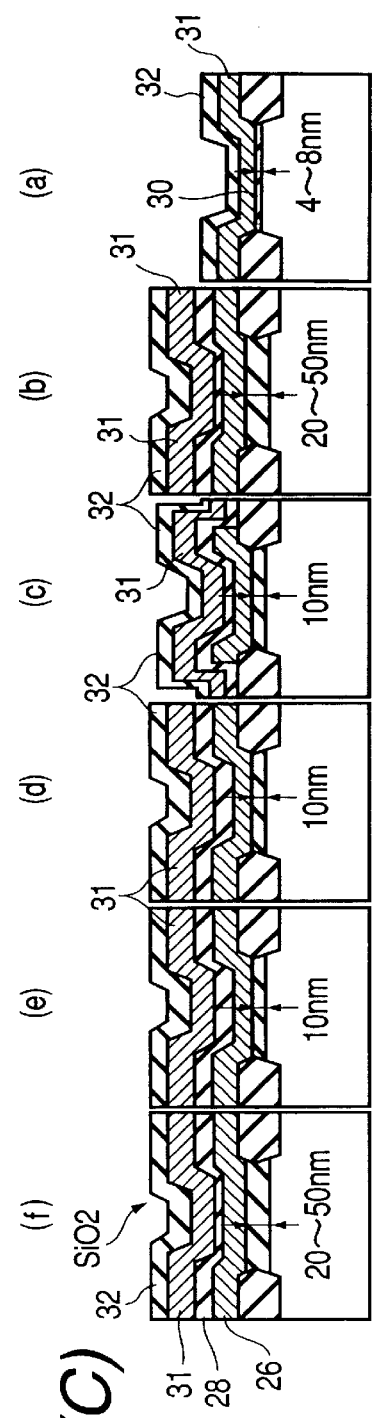

As illustrated in FIG. 12C, a gate oxide film 30 (e.g., of 4 to 8 nm) of the logic MOSFETs (a) is formed illustratively by thermal oxidation or like process. Thereafter, a polysilicon film 31, a $WSi_2$ film 31, and a silicon oxide film ($SiO_2$) film 32 are deposited in that order. The polysilicon film and $WSi_2$ film constitute second layer gates 30.

Figure 13A:
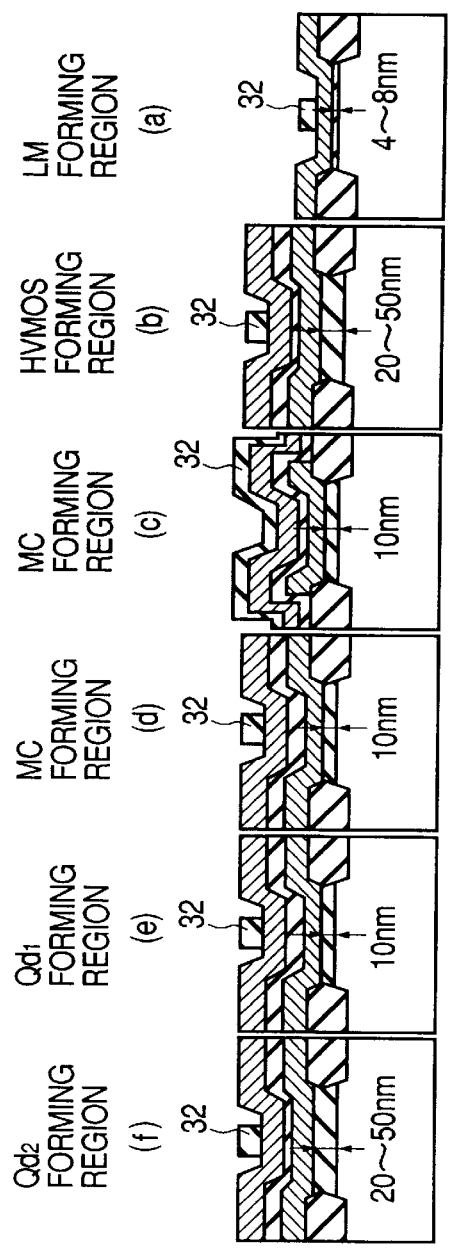
FIGS. 13A, 13B, 13C, 13D and 13E are further partial cross-sectional views showing steps to fabricate key elements in the inventive semiconductor integrated circuit device.

As sketched in FIG. 13A, the $SiO_2$ film 32 is patterned by photo-etching over the selection MOSFETs (f) and (e), the memory cells (d) and (c), the gates of the dielectrically reinforced MOSFETs (b), and the gates of the logic MOSFETs (a). Resist is removed thereafter.

Figure 13B:
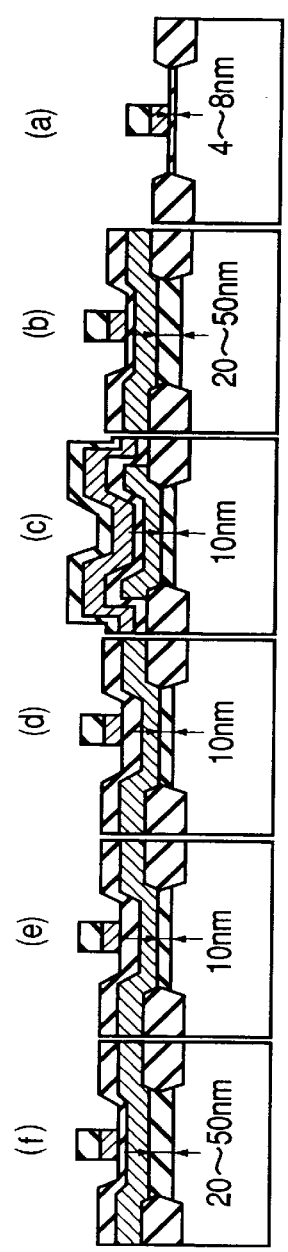

As shown in FIG. 13B, the $SiO_2$ film 32 is masked so as to etch the selection MOSFETs (f) and (e), the memory cells (d) and (c), the second layer gates of the dielectrically reinforced MOSFETs (b), and the second layer gates 30 of the logic MOSFETs (a) ($WSi_2$ film and polysilicon film of the gates).

Figure 13C:
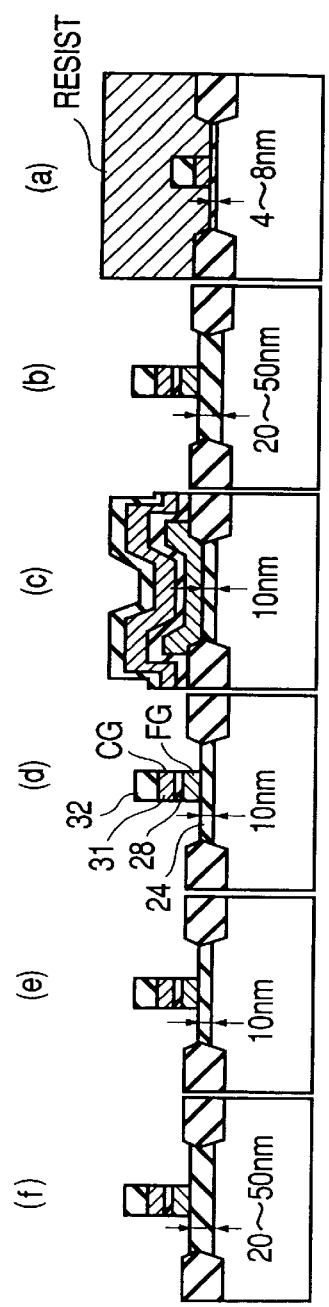
Figure 13D:
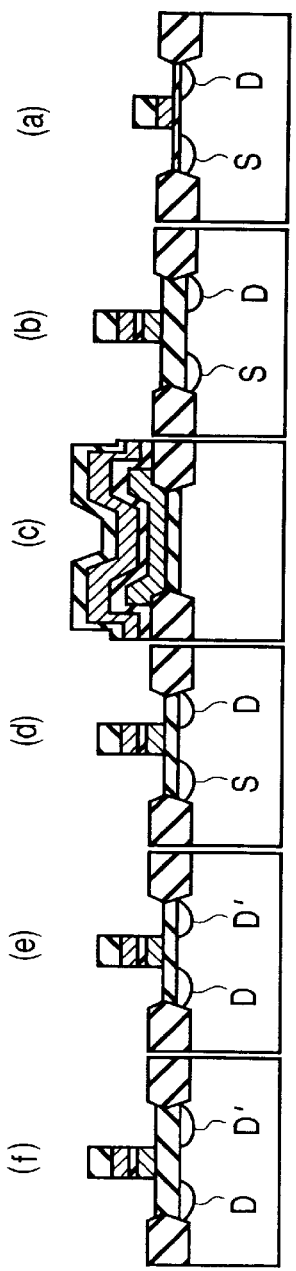
Figure 13E:
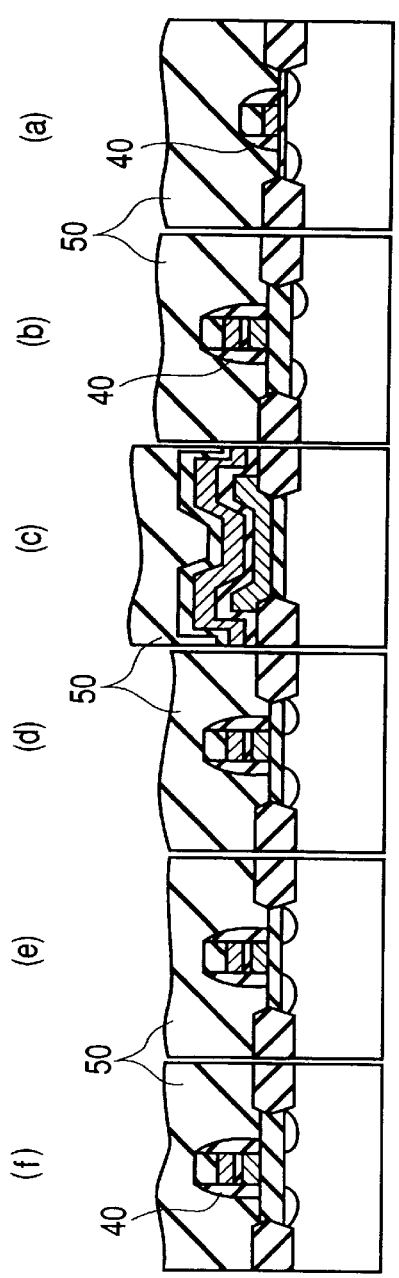
Figure 15A:
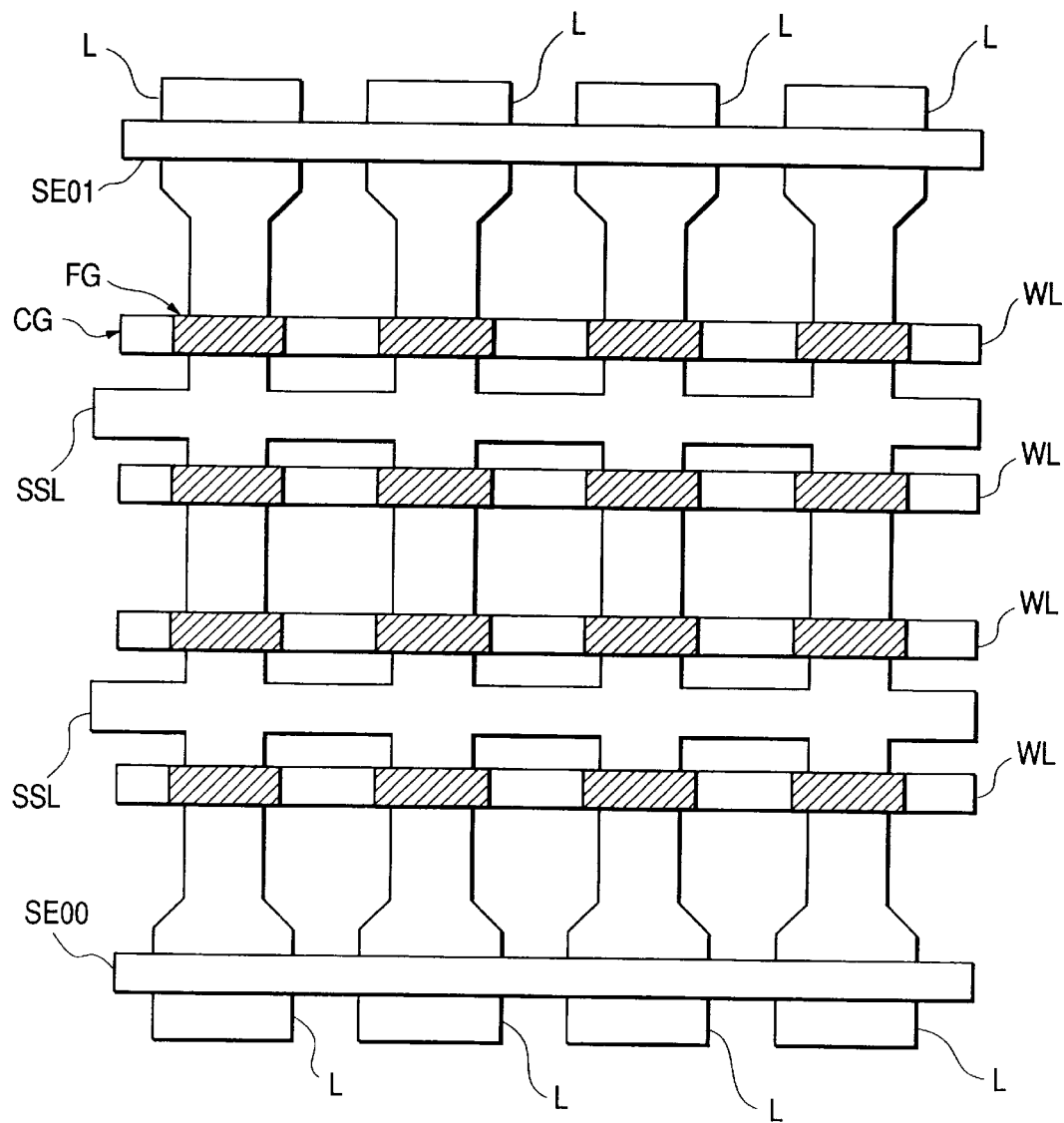
FIGS. 15A and 15B are partial plan views applicable to the fabricating process of FIG. 4.

As depicted in FIG. 13C, with resist left on the gates of the logic MOSFETs (a), photo-etching is carried out to pattern the selection MOSFETs (f) and (e), the memory cells (d) and (c), the ONON film of the dielectrically reinforced MOSFETs (b), and the first layer gate polysilicon film 26. This process forms, in the memory cells (d) and (c) shown in FIG. 15A, the floating gates FG made of the first layer gates, the control gates CG constituted by the second layer gates, and the word lines WL.

Figure 14:
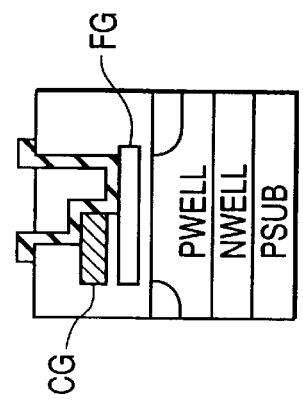
FIG. 14 is a schematic cross-sectional view of an MOSFET element for use with the invention.
Figure 15B:
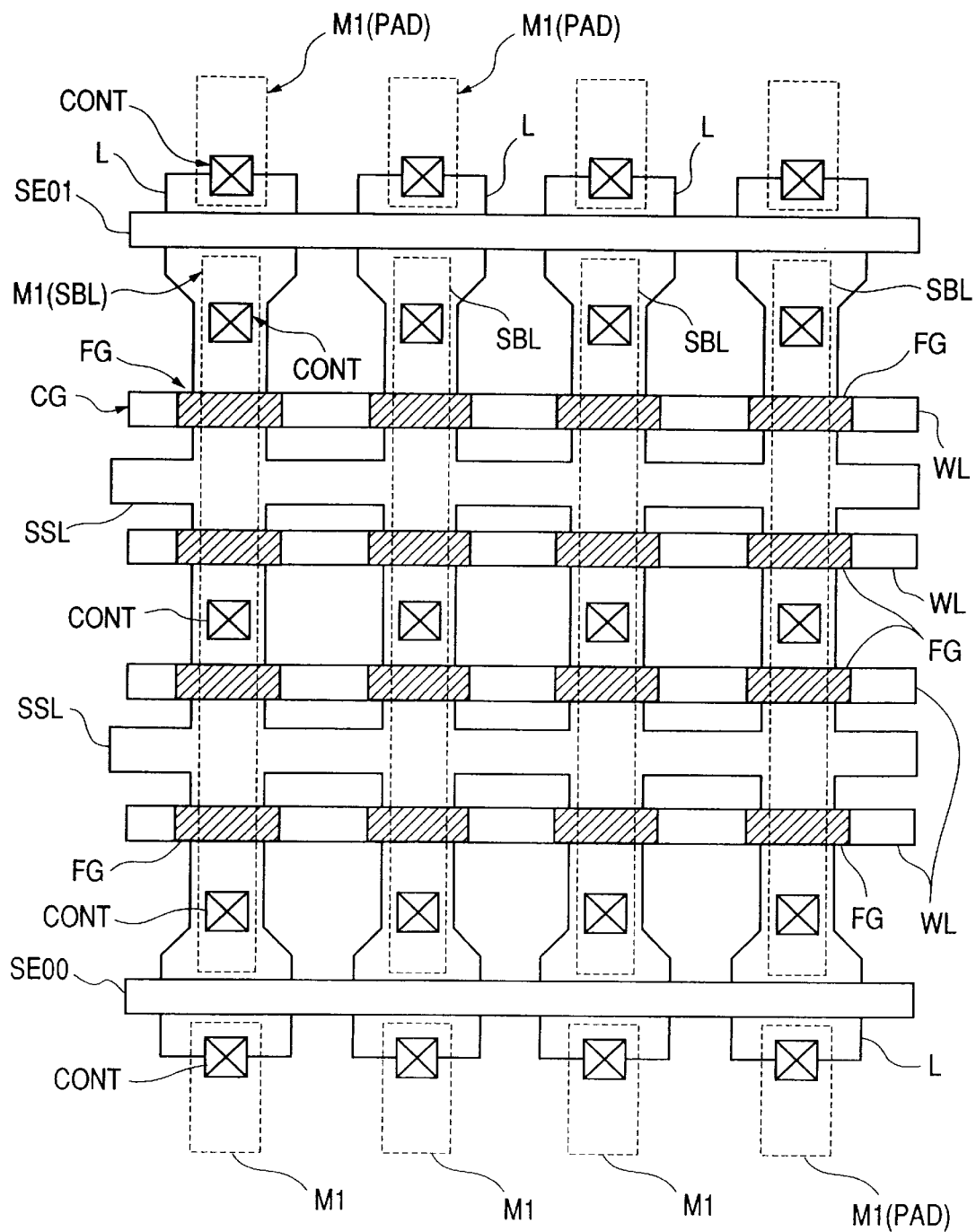

Thereafter, the circuitry is completed by carrying out known fabrication processes forming the source and drain depletion layers (S, D, D') of the MOSFETs (shown in FIG. 13D), side wall spacers 40 (see FIG. 15A), an interlayer insulating film 50, contacts CONT, capacitative elements C of the DRAM, and metal wiring (first metal wiring layer M1 and second metal wiring layer M2, shown in FIG. 15B) followed by final passivation. In the process of forming the metal wiring, as shown in FIGS. 14 and 4, the selection MOSFETs (f) and (e) as well as the dielectrically reinforced MOSFETs (b) have their first layer gates FG and second layer gates CG short-circuited by metal wiring layers. This causes these MOSFETs to function substantially as MOSFETs using the first layer gates FG as their gate electrodes. The short-circuits may be formed alternatively on the field oxide film at the memory block edges.

The embodiments above offer the following major benefits and advantages:

(1) The invention envisages a nonvolatile memory of a hierarchical bit line structure having hierarchical bit lines constituted by a plurality of sub-bit lines. Each sub-bit line is connected to an appropriate main bit line through a first and a second selection MOSFET, the first selection MOSFET having a thin gate insulating film and used for read operations only, the second MOSFET having a thick gate insulating film and used at least for write operations. In a write operation, the first selection MOSFET has its drain or its gate supplied with a predetermined bias voltage so that the gate insulating film of the transistor will not be subjected to a voltage defeating the dielectric strength of the film. This memory permits rapid read operations while preventing dielectric breakdown of gate insulating films during write or erase operations.

(2) The above nonvolatile memory may include nonvolatile memory cells each having a control gate electrode and a floating gate electrode. In a flash erase operation with this preferred structure, a positive high voltage is fed to the control gate electrodes and a negative high voltage is supplied to well regions in which the nonvolatile memory cells are formed, thereby producing an FN tunneling current to charge carriers into the floating gate electrodes from the well regions. In a write operation, a negative high voltage is fed to the control gate electrodes and a positive voltage is supplied through the second selection MOSFET to the drain regions connected to the sub-bit lines, thereby producing an FN tunneling current to discharge carriers from the floating gate electrodes. In the above flash erase operation, the negative high voltage fed to the well regions is also supplied to the gate electrodes of the first and second selection MOSFET, and a negative intermediate voltage is supplied to the gate electrodes as well as to the well region wherein are formed column selection MOSFETs attached to the main bit lines. In the above write operation, the gate electrode of the first selection MOSFET is supplied with a circuit ground potential. This structure ensures rapid read operations while inhibiting dielectric breakdown of the gate insulating films during write and erase operations.

(3) In another preferred structure of the invention, the semiconductor integrated circuit device may include nonvolatile memory cells each having a control gate electrode and a floating gate electrode. In a flash erase operation, a negative high voltage is fed to the control gate electrodes and a positive high voltage is supplied to source lines connected to source regions, thereby producing an FN tunneling current to discharge carriers from the floating gate electrodes into the source regions. In a write operation, a positive high voltage is fed to the control gate electrodes and a positive voltage is supplied through the second selection MOSFET to the drain regions connected to the sub-bit lines, thereby causing a channeling current to flow into the memory cells to which to write data in order to generate hot carriers and charge the generated hot carriers into the floating gate electrodes. In the above flash erase operation, a circuit ground potential fed to the well regions is also supplied to the gate electrodes of the first and the second selection MOSFET. In the above write operation, the gate electrode of the first selection MOSFET is supplied with the circuit ground potential. This structure also ensures rapid read and write operations while preventing dielectric breakdown of the gate insulating films during write and erase operations.

(4) In a further preferred structure of the invention, the semiconductor integrated circuit device may include nonvolatile memory cells each having a control gate electrode and a floating gate electrode. In a flash erase operation, a negative high voltage is fed to the control gate electrodes and a positive high voltage is supplied to well regions in which the nonvolatile memory cells are formed, thereby producing an FN tunneling current to discharge carriers from the floating gate electrodes into the well regions. In a write operation, a positive high voltage is fed to the control gate electrodes and a positive voltage is supplied through the second selection MOSFET to the drain regions connected to the sub-bit lines, thereby causing a channeling current to flow into the memory cells to which to write data in order to generate hot carriers and charge the generated hot carriers into the floating gate electrodes. In the above flash erase operation, a positive intermediate voltage is fed to the gate electrode of the first selection MOSFET, and a circuit ground potential is supplied to the gate electrode of the second selection MOSFET. In the above write operation, the gate electrode of the first selection MOSFET is fed with the circuit ground potential. This preferred structure also permits rapid read and write operations while preventing dielectric breakdown of the gate insulating films during write and erase operations.

(5) In an even further preferred structure of the invention, the semiconductor integrated circuit device may include a memory array corresponding to each of the main bit lines. The memory array is made of a plurality of memory blocks formed by a plurality of sub-bit lines connected to common word lines of the plurality of word lines, wherein data are erased in increments of any of the memory blocks. This structure offers an ease-of-use feature of block-by-block erasure while ensuring rapid read operations and suppressing dielectric breakdown of the gate insulating films during write and erase operations.

(6) In a still further preferred structure of the invention, the semiconductor integrated circuit device may include memory blocks each formed in a first well region corresponding to the memory block in question. The first well region corresponding to each memory block is formed in a second well region which is deeper than the first well region and which has a conductivity type opposite to that of the first well region, whereby the well regions are isolated electrically from one another. This preferred structure also provides the ease-of-use feature of block-by-block erasure while permitting rapid read operations and inhibiting dielectric breakdown of the gate insulating films during write and erase operations.

(7) In a yet further preferred structure of the invention, the semiconductor integrated circuit device may include sub-bit lines formed by a first metal wiring layer. The main bit lines are formed by a second metal wiring layer over the sub-bit lines with an interlayer insulating film interposed therebetween, the second metal wiring layer extending in one direction. The first and the second MOSFET are formed by gate electrodes and a pair of a source and a drain region, the gate electrodes flanking the sub-bit lines and being formed in integral relation with selection lines extending in parallel with the word lines, the paired source and drain regions flanking the gate electrodes and being formed in the direction of the sub-bit lines. The drain region is connected to the main bit lines via the first metal wiring layer and through holes, and the source region is connected to the sub-bit lines via contact holes. Each of the nonvolatile memory cells includes: a word line extending in a direction perpendicular to the sub-bit lines and formed in integral relation with a control gate electrode; a floating gate electrode formed under the control gate electrode with an insulating film interposed therebetween; and a pair of a source and a drain region flanking the floating gate electrode in the direction of the sub-bit lines. A semiconductor region flanked by a first word line and a second word line contiguous to the first word line is used as a common source region for two memory cells, the common source region being connected to a source line. A semiconductor region flanked by the second word line and a third word line contiguous to the second word line is used as a drain region for two memory cells, the drain region being connected via a common contact hole to the sub-bit lines. This preferred structure provides a highly concentrated memory array makeup that ensures rapid read operations while preventing dielectric breakdown of the gate insulating films during write and erase operations.

(8) In another preferred structure of the invention, the semiconductor integrated circuit device may have the gate insulating film of the first selection MOSFET formed by a process which also forms the gate insulating film of the memory cells. This structure permits fabrication of the selection MOSFETs for high-speed read operations while ensuring rapid read operations and inhibiting dielectric breakdown of the gate insulating films during write and erase operations.

(9) In a further preferred structure of the invention, the semiconductor integrated circuit device may have the first selection MOSFET utilizing a floating gate electrode and a control gate electrode which are connected electrically and which are formed by a process fabricating the memory cells as well. This preferred structure also provides fabrication of the selection MOSFETs for high-speed read operations while ensuring rapid read operations and preventing dielectric breakdown of the gate insulating films during write and erase operations.

(10) The invention may also be applied to an FEEPROM to be incorporated in a microcomputer. This structure provides a single-chip microcomputer comprising a high-speed FEEPROM operating on the working frequency of the microcomputer, the memory ensuring rapid read operations and preventing dielectric breakdown of the gate insulating films during write and erase operations.

Although the description above contains many specificities, these should not be construed as limiting the scope of the invention but as merely providing illustrations of the presently preferred embodiments of this invention. It is to be understood that changes and variations may be made without departing from the spirit or scope of the claims that follow. For example, the selection transistor 2 of high dielectric strength may be used selectively for write and erase operations while the selection transistor 1 of low dielectric strength may be used for read operations only. The FEEPROM may have its data terminals omitted and may allow its data terminals to double as I/O terminals for inputting and outputting an address signal, commands for designating an operation mode, write data, and read data on a time series basis. The structure of the nonvolatile memory cells may be varied as desired as long as their contents are erased collectively using at least a tunneling current.

The layout pattern of the sub-bit lines and main bit lines as well as that of the word lines and selection lines are not limited to those described in conjunction with the embodiments; other layout patterns may be used instead. The FEEPROM is not limited to the one incorporated in the single-chip microcomputer; the memory may instead be included in any of diverse digital integrated circuits or may constitute by itself a semiconductor memory device. This invention may also be applied extensively to semiconductor integrated devices incorporating FEPROMs.

Finally, the major effects of the invention are summarized in the form of a flash nonvolatile memory of a hierarchical bit line structure having hierarchical bit lines constituted by a plurality of sub-bit lines. Each sub-bit line is connected to an appropriate main bit line through a first and a second selection MOSFETs, the first selection MOSFET having a thin gate insulating film and used for read operations only, the second MOSFET having a thick gate insulating film and used at least for write operations. In a write operation, the first selection MOSFET has its drain or its gate supplied with a predetermined bias voltage so that the gate insulating film of the transistor will not be subjected to a voltage defeating the dielectric strength of the film. This structure permits rapid read operations while preventing dielectric breakdown of gate insulating films during write and erase operations.

What is claimed is:

1. A semiconductor integrated circuit device comprising:
   a first bit line;
   a first selection MISFET having one of a source and a drain region electrically connected to said first bit line;
   a second selection MISFET having one of a source and a drain region electrically connected to said first bit line;
   a second bit line electrically connected to another of said source and said drain region of said first selection MISFET and electrically connected to another of said source and said drain region of said second selection MISFET; and
   a plurality of memory cells each arranged at points of intersection between said second bit line and one of a plurality of word lines,
   wherein said first selection MISFET has a gate insulating film thinner than a gate insulating film of said second selection MISFET,
   wherein, in a write operation, a first voltage supplied to a gate electrode of said second MISFET is higher than a second voltage supplied to a gate electrode of said first MISFET.

2. A semiconductor integrated circuit device according to claim 1, wherein, in said write operation, said first voltage is higher than a third voltage supplied to said second bit line.

3. A semiconductor integrated circuit device according to claim 1, wherein said memory cell includes a floating gate electrode and a control gate electrode formed over said floating gate electrode,
   wherein each of said first and said second MISFET includes a first gate electrode and a second gate electrode formed over said first gate electrode,
   wherein said floating gate electrode is formed the same level layer as said first gate electrode,
   wherein said control gate electrode is formed the same level layer as said second gate electrode.

4. A semiconductor integrated circuit device according to claim 3, wherein a gate insulating film of said first selection MISFET has substantially the same film thickness as a gate insulating film of said memory cell.

5. A semiconductor integrated circuit device according to claim 1, wherein a gate insulating film of said first selection MISFET has substantially the same film thickness as a gate insulating film of said memory cell.

6. A semiconductor integrated circuit device comprising:
   a first bit line;
   a first selection MISFET having one of a source and a drain region electrically connected to said first bit line;
   a second selection MISFET having one of a source and a drain region electrically connected to said first bit line;
   a second bit line electrically connected to another of said source and said drain region of said first selection MISFET and electrically connected to another of said source and said drain region of said second selection MISFET; and
   a plurality of memory cells each arranged at points of intersection between said second bit line and one of a plurality of word lines,
   wherein said first selection MISFET has a gate insulating film thinner than a gate insulating film of said second selection MISFET, wherein, in a write operation, a first voltage supplied to a gate electrode of said second MISFET is higher than a third voltage supplied to said second bit line.

7. A semiconductor integrated circuit device according to claim 6, wherein said memory cell includes a floating gate electrode and a control gate electrode formed over said floating gate electrode, wherein each of said first and said second MISFET includes a first gate electrode and a second gate electrode formed over said first gate electrode, wherein said floating gate electrode is formed the same level layer as said first gate electrode, wherein said control gate electrode is formed the same level layer as said second gate electrode.

8. A semiconductor integrated circuit device according to claim 7, wherein a gate insulating film of said first selection MISFET has substantially the same film thickness as a gate insulating film of said memory cell.

9. A semiconductor integrated circuit device according to claim 6, wherein a gate insulating film of said first selection MISFET has the same film thickness as a gate insulating film of said memory cell.

10. A semiconductor integrated circuit device comprising:

a first bit line;

a first selection MISFET having one of a source and a drain region electrically connected to said first bit line;

a second selection MISFET having one of a source and a drain region electrically connected to said first bit line;

a second bit line electrically connected to another of said source and said drain region of said first selection MISFET and electrically connected to another of said source and said drain region of said second selection MISFET; and a plurality of memory cells each arranged at points of intersection between said second bit line and one of a plurality of word lines, wherein said first selection MISFET has a gate insulating film thinner than a gate insulating film of said second selection MISFET, wherein said memory cell includes a floating gate electrode and a control gate electrode formed over said floating gate electrode, wherein each of said first and said second MISFET includes a first gate electrode and a second gate electrode formed over said first gate electrode, wherein said floating gate electrode is formed the same level layer as said first gate electrode, wherein said control gate electrode is formed the same level layer as said second gate electrode.

11. A semiconductor integrated circuit device according to claim 10, wherein a gate insulating film of said first selection MISFET has substantially the same film thickness as a gate insulating film of said memory cell.

12. A semiconductor integrated circuit device according to claim 11, wherein, in a write operation, a first voltage supplied to a gate electrode of said second MISFET is higher than a second voltage supplied to a gate electrode of said first MISFET.

13. A semiconductor integrated circuit device according to claim 11, wherein, in a write operation, a first voltage supplied to a gate electrode of said second MISFET is higher than a third voltage supplied to said second bit line.

14. A semiconductor integrated circuit device according to claim 12, wherein, in a write operation, said first voltage is higher than a third voltage supplied to said second bit line.

15. A semiconductor integrated circuit device according to claim 14, wherein said second gate electrode is electrically connected to said first gate electrode in each of said first and said second selection MISFET.

16. A semiconductor integrated circuit device according to claim 10, wherein said second gate electrode is electrically connected to said first gate electrode in each of said first and said second selection MISFET.

17. A semiconductor integrated circuit device according to claim 4, wherein said second gate electrode is electrically connected to said first gate electrode in each of said first and said second selection MISFET.

18. A semiconductor integrated circuit device according to claim 10, wherein said memory cell is comprised of a nonvolatile memory.

19. A semiconductor integrated circuit device according to claim 1, wherein said memory cell is comprised of a nonvolatile memory.

* * * * *